US008111970B2

(12) United States Patent  
Herrmann, Jr.

(10) Patent No.: US 8,111,970 B2
(45) Date of Patent: Feb. 7, 2012

(54) ELECTROMAGNETIC RADIATION FREQUENCY OPTIMIZING DEVICE AND METHOD WITH AMBIENT HEAT CONVERSION DEVICE

(76) Inventor: Richard J. Herrmann, Jr., Clifton Park, NY (US)

( * ) Notice: Subject to any disclaimer, the term of this patent is extended or adjusted under 35 U.S.C. 154(b) by 0 days.

(21) Appl. No.: 12/895,985

(22) Filed: Oct. 1, 2010

(65) Prior Publication Data
US 2011/0075251 A1 Mar. 31, 2011

Related U.S. Application Data

(63) Continuation-in-part of application No. 12/566,966, filed on Sep. 25, 2009.

(51) Int. Cl.
  *G02B 6/00* (2006.01)
  *G02F 1/35* (2006.01)
  *H01L 25/00* (2006.01)
(52) U.S. Cl. ........ 385/147; 385/900; 136/243; 136/244; 136/245; 136/246; 136/258; 359/326; 359/328; 359/329; 359/332
(58) Field of Classification Search .......... 385/900, 385/147; 136/243–246, 258; 359/326, 328–329, 359/332
See application file for complete search history.

(56) References Cited

U.S. PATENT DOCUMENTS

| | | | |
|---|---|---|---|
| 3,353,896 A | 11/1967 | Blattner | |
| 3,490,950 A | 1/1970 | Myer | |
| 3,560,874 A | 2/1971 | Duguay | |
| 3,655,265 A | 4/1972 | Hammond | |
| 4,202,704 A | 5/1980 | Hodgson et al. | |
| 4,264,141 A | 4/1981 | Guers et al. | |
| 4,289,920 A * | 9/1981 | Hovel | 136/246 |
| 4,652,083 A | 3/1987 | Laakmann | |
| 4,703,992 A | 11/1987 | Yeh | |
| 5,321,539 A | 6/1994 | Hirabayashi et al. | |
| 5,500,054 A | 3/1996 | Goldstein | |
| 5,517,346 A | 5/1996 | Eckstein et al. | |
| 5,592,314 A | 1/1997 | Ogasawara et al. | |
| 6,286,504 B1 * | 9/2001 | Suginobu | 126/577 |
| 6,341,870 B1 | 1/2002 | Koch et al. | |
| 6,476,312 B1 * | 11/2002 | Barnham | 136/247 |
| 6,541,694 B2 | 4/2003 | Winston et al. | |
| 6,809,856 B2 * | 10/2004 | Reed et al. | 359/326 |

(Continued)

OTHER PUBLICATIONS

Application No. PCT/US2010/050130, International Search Report and the Written Opinion of the International Searching Authority, or the Declaration dated Nov. 19, 2010. 21 pages.

(Continued)

*Primary Examiner* — Brian M. Healy
*Assistant Examiner* — Guy Anderson
(74) *Attorney, Agent, or Firm* — Schmeiser, Olsen & Watts, LLP

(57) ABSTRACT

A device comprising a conversion channel including: a first end configured to accept ambient electromagnetic radiation, the ambient electromagnetic radiation having an initial frequency, a second end configured to allow the ambient electromagnetic radiation to exit, and at least two opposing walls connecting the first end and the second end, wherein the at least two opposing walls include one or more crystals, the at least two opposing walls being separated by at least one-half of a wave length; wherein when the ambient electromagnetic radiation interacts with the one or more crystals of the at least two opposing side walls, the initial frequency of the ambient electromagnetic radiation being repeatedly increased to an optimal frequency is provided. Furthermore, an associated method is also provided.

20 Claims, 13 Drawing Sheets

U.S. PATENT DOCUMENTS

| | | | |
|---|---|---|---|
| 6,842,217 | B1 | 1/2005 | Miller et al. |
| 6,940,638 | B2 | 9/2005 | Kondoh et al. |
| 7,081,584 | B2 | 7/2006 | Mook |
| 7,149,377 | B2 | 12/2006 | Sidorin et al. |
| 7,193,771 | B1 | 3/2007 | Smith et al. |
| 7,355,162 | B2 | 4/2008 | Sidorin |
| 7,369,735 | B2 | 5/2008 | Nyhart, Jr. |
| 7,565,050 | B2 * | 7/2009 | Lee et al. ............... 385/133 |
| 7,929,200 | B2 * | 4/2011 | Miteva et al. ........... 359/326 |
| 2001/0026667 | A1 | 10/2001 | Kawanishi et al. |
| 2003/0063884 | A1 | 4/2003 | Smith et al. |
| 2004/0031517 | A1 | 2/2004 | Bareis |
| 2005/0030613 | A1 * | 2/2005 | Reed et al. ............. 359/326 |
| 2006/0191566 | A1 * | 8/2006 | Schaafsma ............. 136/246 |
| 2007/0246040 | A1 | 10/2007 | Schaafsma |
| 2007/0277869 | A1 | 12/2007 | Shan et al. |
| 2009/0014056 | A1 * | 1/2009 | Hockaday ............... 136/247 |
| 2009/0188544 | A1 * | 7/2009 | Kobayashi et al. ...... 136/244 |
| 2009/0224659 | A1 * | 9/2009 | Miteva et al. ........... 313/504 |

OTHER PUBLICATIONS

"Thermo-optic tuning and switching in SOI waveguide Fabry-Perot microcavities" Marcel W. Pruessner, Todd H. Stievater, Mike S. Ferraro, and William S. Rabinovich, Optics Express, vol. 15, Issue 12, pp. 7557-7563 doi:10.1364/OE.15.007557, discusses thermo-optic tuning, http://www.opticsinfobase.org/oe/abstract.cfm?uri=oe-15-12-7557 (last visited Apr. 2, 2009).

Liquid Crystal Fabry-Perot Tunable Filter, Boulder Nonlinear Systems, May 9, 2001, www.bnonlinear.com/papers/LCFabryFilter.pdf (last visited on Apr. 2, 2009).

U.S. Appl. No. 12/566,966, filed Sep. 25, 2009.

* cited by examiner

| Color | Original Frequency (Hz) | Red Target Frequency (Hz) | Required Amount of Shift (Hz) | Number of Doppler Interactions (Hz) |
|---|---|---|---|---|
| Violet | $7.0 \times 10^{14}$ | $4.5 \times 10^{14}$ | $2.5 \times 10^{14}$ | 111,607 |
| Blue | $6.5 \times 10^{14}$ | $4.5 \times 10^{14}$ | $2.0 \times 10^{14}$ | 89,285 |
| Green | $6.0 \times 10^{14}$ | $4.5 \times 10^{14}$ | $1.5 \times 10^{14}$ | 66,964 |
| Yellow | $5.25 \times 10^{14}$ | $4.5 \times 10^{14}$ | $7.5 \times 10^{13}$ | 33,482 |
| Orange | $5 \times 10^{14}$ | $4.5 \times 10^{14}$ | $5.0 \times 10^{13}$ | 22,321 |

FIG.2

ELECTROMAGNETIC RADIATION FREQUENCY OPTIMIZING DEVICE AND METHOD WITH AMBIENT HEAT CONVERSION DEVICE

CROSS-REFERENCE TO RELATED APPLICATIONS

This application is a continuation-in-part of U.S. application Ser. No. 12/566,966, filed Sep. 25, 2009.

FIELD OF TECHNOLOGY

The following relates to a device and method for optimizing and altering electromagnetic frequency using Doppler shifts of electromagnetic radiation, and, more specifically, to embodiments having a conversion device to convert ambient heat into electricity.

BACKGROUND

Photovoltaic (PV) devices operate optimally when incident electromagnetic radiation (EMR) has an energy that corresponds closely to the electron band gap of the PV material. Solar EMR is made up of a continuous spectrum of frequencies and wavelengths. When a photon with an energy less than the electron band gap of a given PV material, the photon lacks sufficient energy to move the electron from its valence band into the conductive band, and the PV material produces no electric current. When a photon has an energy greater than that of the PV material's electron band gap, the electron is moved to the conductive band, consuming the energy corresponding to the band gap, and the excess energy (i.e. the difference between the incoming photon and the PV electron band gap) is not utilized and otherwise lost, generally as heat. Using a radiation source having an energy optimized for the particular PV material used in a solar cell array increases the efficiency of the PV material because less EMR is lost or wasted as heat, and more electricity is produced. Because of the rising demand for alternative energy sources, the need for an efficient alternative energy exists. A major deficiency in alternative energy sources, such as solar energy, include low rate of conversion of EMR to electricity.

Therefore, a need exists for a device and method to increase efficiency of PV cells and avoid excess loss of EMR by altering and optimizing the frequency of incident EMR such that energy production in a PV cell is maximized.

Moreover, the frequency of the vibration and the frequency of the radiation are directly related to a temperature of a substance. Typically, the higher the temperature, the greater the speed of vibration and the higher the frequency of emitted radiation. Additionally, heat generally moves from a higher energy (temperature) location to a lower energy location. Thus, constant ambient heat from high temperature locations and low temperature locations is a renewable source of energy. However, the frequency of the radiation emitted by ambient temperature matter is generally below the threshold necessary to produce electricity using a photovoltaic cell.

Therefore, a need exists for a device and method to convert ambient heat into electricity.

SUMMARY OF THE INVENTION

A first general aspect relates to an electromagnetic radiation optimization device comprising a crystal undergoing a vibration, said crystal positioned in an opening having walls, wherein an interaction between an incoming electromagnetic radiation and said vibration of said crystal optimizes a frequency of said electromagnetic radiation.

A second general aspect relates to an electromagnetic radiation frequency optimizing device comprising a first end having a separator positioned proximate said first end, a second end having a focusing member positioned proximate said second end, at least two opposed walls having a reflective surface, wherein said at least two opposed walls connect said first end and said second end, and at least one absorption area located on said reflective surface.

A third general aspect relates to a method of optimizing electromagnetic radiation comprising providing a channel having a first end, a separator positioned proximate said first end, a second end, a focusing member positioned proximate said second end, at least two parallel walls having an reflective surface, wherein said at least two parallel side walls connect said first end and said second end, and at least one absorption area located on said reflective surface, determining an optimal frequency relative to a usable frequency of a target, separating an incoming electromagnetic radiation into component frequencies, vibrating said at least two parallel walls, wherein said parallel walls contain at least one crystal capable of vibration, directing said incoming electromagnetic radiation toward said at least two parallel walls, wherein contact between said incoming electromagnetic radiation and said vibration of said at least one crystal alters a frequency of said electromagnetic radiation toward said optimal frequency, and passing said optimal frequency through said second end.

A fourth general aspect relates to a method of providing a crystal undergoing a vibration, said crystal positioned in an opening having walls, wherein an interaction between an incoming electromagnetic radiation and said vibration of said crystal optimizes a frequency of said electromagnetic radiation, collecting said incoming electromagnetic radiation from a source through said first end, shifting the frequency of said electromagnetic radiation within said channel to achieve an optimal frequency of said electromagnetic radiation; and positioning a photovoltaic material a distance away from said channel.

A fifth general aspect relates to a device comprising a conversion channel including: a first end configured to accept ambient electromagnetic radiation, the ambient electromagnetic radiation having an initial frequency, a second end configured to allow the ambient electromagnetic radiation to exit, and at least two opposing walls connecting the first end and the second end, wherein the at least two opposing walls include one or more crystals, the at least two opposing walls being separated by at least one-half of a wave length; wherein when the ambient electromagnetic radiation interacts with the one or more crystals of the at least two opposing side walls, the initial frequency of the ambient electromagnetic radiation being repeatedly increased to an optimal frequency.

A sixth general aspect relates to a device comprising a first side wall and a second side wall connected forming a conversion channel, the conversion channel having a first end and a second end, wherein the first side wall is constructed out of one or more crystals and the second side wall is a reflective surface; wherein the conversion channel captures ambient infrared radiation having an initial frequency from an environment proximate the first end, and repeatedly increases the initial frequency to an optimal frequency through a plurality of interactions between the ambient infrared radiation and at least one atom of the one or more crystals making up the second wall, further wherein the at least one atom is moving toward the incoming infrared radiation during a single interaction.

A seventh aspect relates generally to a method of converting ambient heat to electricity comprising providing a conversion device including: a first end configured to accept ambient electromagnetic radiation, the ambient electromagnetic radiation having an initial frequency, a second end configured to allow the ambient electromagnetic radiation to exit, and at least two opposing walls connecting the first end and the second end, wherein the at least two opposing walls include one or more crystals, the at least two opposing walls being separated by at least one-half of a wave length, utilizing vibration of one or more crystals making up the at least two opposing walls, wherein the vibration causes atoms of one or more crystals to move in a direction towards the accepted ambient electromagnetic radiation, and repeatedly increasing the initial frequency of the ambient electromagnetic radiation through interactions with the at least two opposing walls until the ambient electromagnetic radiation reaches an optimal frequency.

The foregoing and other features of construction and operation will be more readily understood and fully appreciated from the following detailed disclosure, taken in conjunction with accompanying drawings.

BRIEF DESCRIPTION OF THE DRAWINGS

Some of the embodiments of this invention will be described in detail, with reference to the following figures, wherein like designations denote like members wherein:

FIG. 2 depicts a numerical table of an embodiment of various calculations including the number of Doppler interactions for a given frequency;

DETAILED DESCRIPTION OF THE DRAWINGS

Figure 1:
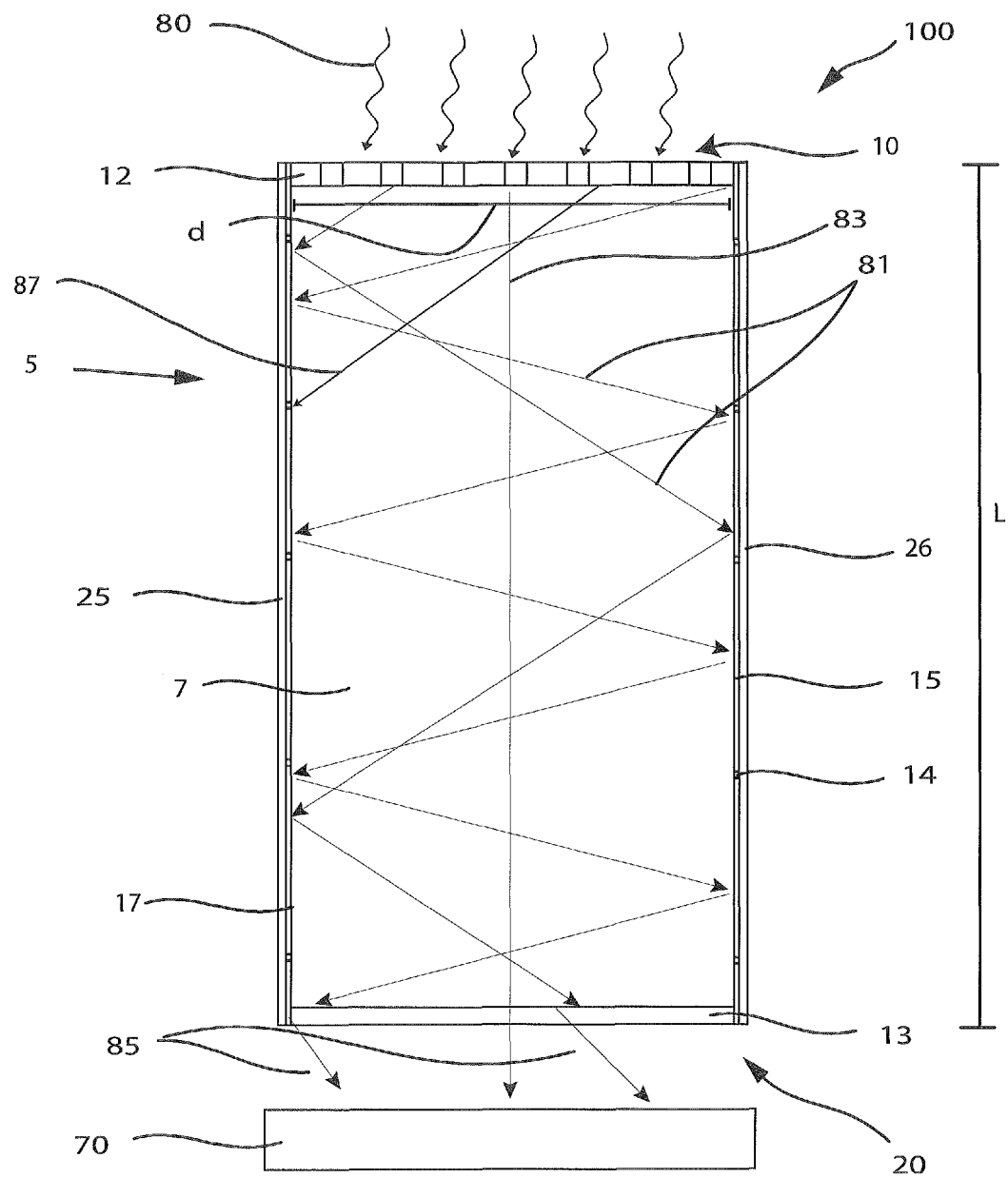
FIG. 1 depicts a cross-section view of an embodiment of an optimization device while incident electromagnetic radiation enters the channel.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of an embodiment. The features and advantages of the present invention are illustrated in detail in the accompanying drawings, wherein like reference numerals refer to like elements throughout the drawings.

Various embodiments of an electromagnetic radiation frequency altering and optimizing device of the present invention may optimize incident solar electromagnetic radiation 80 into an energy range that may be used in conjunction with a target, such as a photovoltaic material 70. Incident electromagnetic radiation 80 may include radio waves, microwaves, terahertz radiation, infrared radiation, visible light, ultraviolet radiation, X-rays and gamma rays. Optimizing solar electromagnetic radiation 80 involves changing, altering, or shifting the frequency of the incident electromagnetic radiation 80 (and therefore wavelength and energy level) using Doppler shifts. A Doppler shift may either "blue shift" or "red shift" incident electromagnetic radiation to a desired optimal frequency. By performing multiple Doppler shifts, a desired optimal frequency may be attained.

A Doppler shift may change the frequency and wavelength of an incident electromagnetic radiation wave when the reflector is moving in relation to the incident wave. When incident electromagnetic radiation 80 is reflected off a surface that is moving generally in the opposite direction as an electromagnetic radiation wave, a "blue shift" occurs, and the resulting reflected electromagnetic radiation has a higher frequency than the initial electromagnetic radiation wave. Conversely, when an electromagnetic radiation wave is reflected of a surface which is moving in a direction generally the same direction of the electromagnetic radiation 80, a "red shift" occurs, and the resulting reflected wave has a lower frequency. By coordinating or synchronizing the vibration of the plurality of crystals 17 comprising the inner reflective surface 15 and multiplying the effects of small Doppler shifts, an optimal electromagnetic radiation 85 may be obtained. Thus, the optimal electromagnetic radiation 85 has generally undergone blue or red shifts to achieve the desired optimal frequency before it is focused toward a target, such as a photovoltaic material 70.

FIG. 1 depicts a single stage channel 5 designed to optimize and alter frequency of incident electromagnetic radiation 80. The channel 5 may also be referred to as a Doppler channel, pathway, opening, conduit, duct, fluting, passage, pipe, tunnel, cavity or the like. The channel 5 may have a first end 10, a second end 20, a planar surface 7 connecting at least two side walls 25, 26. Moreover, the channel 5 may have an inner reflective surface 15, described in more detail infra. The shape of the channel 5 may vary. In an exemplary embodiment, the channel 5 will have two opposing, parallel side walls 25, 26, forming a 90° angle with the planar surface 7; the at least two side walls 25, 26 may be separated by a distance, d, which may vary depending on the desired optimal frequency. A separator 12 is positioned within the channel 5. In one embodiment, the separator 12 may be positioned proximate the first end 10. Also located within the channel 5 is a focusing member 13. In one embodiment, the focusing member 13 may be positioned proximate the second end 20. Furthermore, at least one absorption area 14 is located on the inner reflective surface 15. In many embodiments, the channel 5 may have multiple absorption areas 14.

The channel 5 may receive, accept, capture, and/or collect incident electromagnetic radiation 80 at the first end 10.

When the incident electromagnetic radiation enters the channel 5 at the first end 10, it may contact, pass through, reach, etc., the separator 12 which may be located proximate the first end 10. The separator 12 may be any device capable of separating and directing incident electromagnetic radiation 80 into its component frequencies by refraction, diffraction, or filtering. In one embodiment, the separator 12 may be a prism. In another embodiment, the separator 12 may be a diffraction grating. In another embodiment, the separator 12 may be a system of filters. In yet another embodiment, the separator 12 may be concave and/or convex minors. The separator 12 may also be any combination of the aforementioned devices.

The separator 12 may separate incident electromagnetic radiation 80 into component frequencies and may direct the separated frequencies toward a side wall 25, 26 of the channel 5, with each frequency or group of frequencies targeted to a particular location within the channel 5. Furthermore, incident electromagnetic radiation 80 which may already be at or near the optimal and usable energy and frequency range for a particular target, such as a photovoltaic material 70, may be separated and directed by the separator 12 to travel straight through the channel 5, with minor incidental or no reflective interactions with the inner reflective surface 15. As a result, the pre-optimal electromagnetic radiation 83 may be immediately directed toward the second end 20 and photovoltaic material 70, free from any frequency modification or alteration. The determination of whether the incident electromagnetic radiation 80 is near or at optimal frequency may depend on the particular photovoltaic material 70, and other variables known to those skilled in the art.

Other frequencies of incident electromagnetic radiation 80, otherwise not useable by the photovoltaic material 70 may be separated and directed by the separator 12 to be reflected off the at least two side walls 25, 26 of channel 5, where it may interact with the inner reflective surface 15. The interaction between the inner reflective surface 15 and the incident electromagnetic radiation 80 performs a Doppler shift to the otherwise unusable frequency for the photovoltaic material 70. The Doppler shift performed on the incident electromagnetic radiation 80 may shift, alter, change, etc., it to a frequency that may be usable by the photovoltaic material 70. Because the otherwise unusable incident electromagnetic radiation 80 may undergo a change in frequency to a desired optimal frequency (or within the photovoltaic material's 70 usable energy range), the efficiency of a photovoltaic material 70 may be increased. In one exemplary embodiment, the separator 12 may separate and direct various frequencies of incident electromagnetic radiation 80 in different directions and may establish the reflection sequence which may result in the proper Doppler shifts according to the desired optimal frequency.

Furthermore, a focusing member 13 is located proximate the second end 20 of the channel 5. The focusing member 13 may be any lens, grating, system of minors, a transparent medium, and the like. The focusing member 13 may direct and/or focus all electromagnetic radiation traveling through the channel 5 in a path not parallel to the side walls 25, 26 to exit the second end 20 such that the optimal electromagnetic radiation 85 exits the channel 5 and hits the target 70. For example, the optimal electromagnetic radiation 85, the pre-optimal electromagnetic radiation 83, and incident electromagnetic radiation 80 may exit the second end 20 at a 90° angle to the channel 5, or may exit the second end 20 at any angle and spread outward, and come into contact with a photovoltaic material 70. In an alternate embodiment, the focusing member 13 may direct and/or focus exiting electromagnetic radiation at angle greater or less than 90°. Moreover, waste electromagnetic radiation 87 (discussed infra) may not reach the focusing member 13 because it is collected and/or absorbed by the absorption areas 14; thus, 100% of the incident electromagnetic radiation does not always pass through the focusing member 13.

With continued reference to FIG. 1, incident electromagnetic radiation 80 that is not at an optimal frequency for the photovoltaic material 70 (target) may enter the channel 5 at the first end 10 and reach the separator 12, and may be directed toward the sides walls 25, 26 at an angle, Ø, calculated to achieve desired optimal frequency shifts as the incident electromagnetic radiation 80 reflects within the channel 5. For example, incident electromagnetic radiation 80 may enter the channel 5 and need to undergo a "blue shift" to change, alter, or shift its frequency to fall within the usable range of the photovoltaic material 70. The separator 12 may direct the incident electromagnetic radiation 80 toward at least one of the two side walls 25, 26 at a calculated angle, Ø, to perform the Doppler shift required to achieve the necessary frequency alteration. The incident electromagnetic radiation 80 that is separated and directed by the separator 12 may be called directed electromagnetic radiation 81. When the directed electromagnetic radiation 81 reaches the inner reflective surface 15 at an angle, Ø, a controlled, calculated Doppler shift may occur. A Doppler shift may occur when the directed electromagnetic radiation 81 interacts with the inner reflective surface 15 because of vibrating crystal atoms in the reflective surface 15. Moreover, if the contact occurs at a point in the crystal's vibration where the crystal is moving generally in the opposite direction as the directed electromagnetic radiation 81, the result of the interaction may be a "blue shift", and the resulting frequency may be increased.

The inner reflective surface 15 may be made up of a plurality of crystals 17, which may be suited for vibrating at high to ultra-high frequencies. Alternatively, the inner reflective surface 15 may comprise a single crystal suited to vibrate at high to ultra high frequencies. A crystal may be defined as a solid material whose atoms, molecules, or ions are arranged in a repeating pattern extending in all three spatial dimensions. The inner reflective surface 15 may contain ultra-high frequency vibrating atoms, which may or may not be made of crystals. Furthermore, the inner reflective surface 15, crystal, or plurality of crystals 17 may be comprised of Silicon, $SiO_2$, $LiNbO_3$, GaAs, GeAsSe, $BaF_2$, ZnSe, ZnS, $Al_2O_3$, ceramics, metals, carbon, diamond, beryllium, iron, brass, copper, tin, nickel, chromium, magnesium, barium titanate, zinc sulphide, tourmaline, hydrogen phosphate, magnesium oxide, silicon nitrate, silicon carbon, hafnium or any combinations or mixtures thereof. It is noted that reflective gasses and liquids may also be used, for example, enclosed in Plexiglas, which could be used as a substrate or other structural material. In the various embodiments of the Doppler channel 5, the reflective crystal surface 15 may be attached, fastened, adhered, or otherwise affixed to the inner surfaces of the side walls 25, 26 of the channel 5. The reflective crystal surface 15 may also be grown by using techniques that are well known in the art, (e.g. the vapor-liquid-gas method or the surface diffusion method, among other methods). The side walls 25, 26 may be made of any material that provides rigidity, structure, and allows for adherence or growth of crystals, and resists the moderate heat levels that may develop when the channel 5 may be continuously exposed to the heat of the sun, or other sources electromagnetic radiation. Furthermore, the side walls 25, 26 may be smooth or may be uneven and rough, and may also be circular, rectangular, or may be just any practical shape. Accordingly, the side walls 25, 26 may be made out of materials including, but not limited to, a metal, a plastic or thermal resistant polymer, a suitable substrate for growing crystals such as silicon, and the like. In an alternative embodiment, the crystals may form the side walls 25, 26.

In yet another embodiment, where a single crystal is used, the side walls 25, 26 may be comprised of a single crystal. In another embodiment, a plurality of crystals 17 may be placed on a structural material, such as a substrate. The optimization device 100 may only need a very thin shell to operate. For example, the thinnest material that possesses the desired characteristics and may be economical to machine manufacture might be the best material to act as a shell around the crystal or plurality of crystals 17. The advantage of using a shell may be that less energy is required to achieve the vibrations of the crystalline atoms. However, if the optimization device 100 does not need to be synchronized, or is designed to operate without synchronized vibrations, than any construction material may be used to support the inner reflective surface 15, the crystal, or the plurality of crystals 17. In most embodiments, the crystals will be placed on a substrate to provide some support, which may be anything that does not adversely affect the performance of the crystals. In one exemplary embodiment, the crystals may be embedded in Plexiglas covers to provide support, and may allow the placement of the side walls 25, 26 and the separator 12 to be fixed. For example, the side walls 25, 26 and the separator 12 and focusing member 13 may be inserted in a panel of Plexiglas or they may be placed on a workboard which could be covered with Plexiglas.

Positioned somewhere inside the channel 5, and located on the inner reflective surface 15 of the at least two side walls 25, 26 may be an absorption area 14, or a plurality of absorption areas 14. This absorption area 14 may be used to absorb incident electromagnetic radiation 80 which would otherwise be wasted as heat. For example, the absorption area 14 may collect or absorb unusable electromagnetic radiation. Unusable electromagnetic radiation may be electromagnetic radiation that may not be utilized by the photovoltaic material 70, or any given target. This unusable electromagnetic radiation may be known as waste electromagnetic radiation 87. As waste electromagnetic radiation 87 is absorbed by the absorption area 14, the temperature of the absorption area 14 may be increased. The absorption area 14 may be in conductive communication with the inner reflective crystal surface 15, thereby allowing heat generated by absorption of waste electromagnetic radiation 87 in the absorption areas 14 to be conducted to the reflective crystal surface 15, and raise the temperature of the inner reflective crystal surface 15. As the temperature of the inner reflective crystal surface 15 rises, the atoms of the crystals may vibrate with increasing frequency. The vibrations of the crystal caused by the absorption of waste electromagnetic radiation 87 may optimize (i.e. perform a Doppler shift) the incident electromagnetic radiation 80 when there is an interaction between the incident electromagnetic radiation 80 and the vibrations of the crystal. The absorption area 14 may be made of a non-reflective surface, any optically absorbing material, or any other material that may absorb electromagnetic energy and transform it to another form of energy, such as heat.

The presence of at least one absorption area 14 or more than one absorption area 14 located throughout the channel 5 may allow the optimization device 100 to be completely self-sustaining. No external power or energy need be used to power the vibrations of the crystals, although an external electric current may be applied to the channel 5 to heat the crystals and power the vibrations. For example, the incoming electromagnetic radiation 80 entering the first end 10 may be separated and directed and may come into contact with a spot on the surface of one of the side walls 25, 26 where an absorption area 14 is located. Thus, the absorption area 14 collects the waste electromagnetic radiation 87 which would normally be wasted as heat, or is unusable, and may use it to generate the vibrations of the crystals. Advantageously, the optimization device 100 may operate without requiring energy output from an external source. Accordingly, creating vibrations of the crystal atoms forming the side walls 25, 26 of the channel 5 by use of the energy contained in the ambient temperature and/or the energy contained in the waste electromagnetic radiation 87 may properly and solely power the optimization device 100.

Moreover, the waste electromagnetic radiation 87 may be harvested and utilized to generate the vibrations in a number of other ways such as directing the waste electromagnetic radiation 87 to select areas of the side walls 25, 26 which are not reflective, in particular, towards absorption areas 14, such that the waste electromagnetic radiation 87 energizes the crystals by the energy transferring by means of phonons throughout the crystal causing the desired vibrations. In addition, after the incident electromagnetic radiation 80 passes through the separator 12 and is separated into its component frequencies, waste electromagnetic radiation 87, such as waste portions of the spectrum like infrared, may be directed towards the side walls 25, 26 at an angle, $\emptyset$, such that absorption occurs rather than reflection. Also, the waste electromagnetic radiation 87 may be directed by a series of minors to the edge of the side wall 25, 26 to induce vibrations. Furthermore, the side walls 25, 26 may be constructed out of a substance which may reflect the higher frequencies but absorb the infrared portions of the spectrum, and this absorption may be utilized as the energy source for the vibrations.

If a piezoelectric substance is utilized in comprising the side walls 25, 26, such as quartz crystal, electricity and a feedback loop may be applied to cause the substance to vibrate in a desired fashion. A feedback loop may obtain a constant oscillation. Although, small amounts of energy may be needed to maintain the vibrations in a quartz crystal, the potential energy output, especially if sunlight is concentrated towards the optimization device 100 should exceed the energy needed to cause and maintain the harmonic vibrations in the crystals. For example, mirrors may be used to capture and/or concentrate the sunlight from a greater area and direct it towards the optimization device 100. It is noted that the energy produced by the solar cells prior to the activation of the optimization device 100 may be more than sufficient to activate the constant oscillation which may energize the side walls 25, 26 (the crystal atoms). Likewise, reflected electromagnetic radiation 84 is being both upshifted and downshifted, the net effect of the incident electromagnetic radiation 80, with respect to the channel 5, may be neutral.

Referring again to FIG. 1, a distance, d, between the two side walls 25, 26, the length, L, of the channel 5 may be carefully calculated to ensure that directed electromagnetic radiation 81 which undergoes a blue shift on its first interaction with the inner reflective surface 15 reaches an opposite side 26 (if the first interaction was with side wall 25) of the channel 5 and reflects off another crystal atom which is also moving generally in the same direction as the reflected electromagnetic radiation 84, resulting in a further blue shift. Conversely, incident electromagnetic radiation 80 frequencies that need to undergo a red shift to become optimized may enter the channel 5 and follow the same procedure to perform a blue shift, except the contact between the directed electromagnetic radiation 81 and the vibrating crystal atoms in the inner reflective surface 15 may occur at a point in the crystal's vibration where the crystal is moving generally in the opposite direction as the directed electromagnetic radiation 81, resulting in a red shift, and thus the frequency decreases. Moreover, the difference between the speed of light and the speed of a vibrating atom in the channel 5 is so great that minor errors in calculated distances, d and L, may be harmless with respect to the Doppler interactions.

The vibration speed of the atoms in the crystal surface 15 may vary depending on temperature. As the temperature rises, the atoms may tend to vibrate faster. As the speed of vibration changes, the amount of Doppler shift that occurs when the directed electromagnetic radiation 81 interacts with the moving atom may change accordingly. By changing the ambient temperature of the reflective material coating or comprising the side walls 25, 26, the amount of Doppler shift and the number of reflections in a channel 5 may be changed. As incident electromagnetic radiation 80 interacts with the side wall 25, 26 of the channel 5, there may be some waste electromagnetic radiation 87, which may be lost as heat. The waste electromagnetic radiation 87 may be collected by the absorption areas 14 to use the resulting heat from the absorption to heat the surrounding reflective surfaces 15, thereby increasing the frequency of vibration. Furthermore, this heat may be used to impart energy to the reflective surfaces 15 in order to provide energy to perform the Doppler shifts and vibrate the crystal atoms.

While it is understood that the directed electromagnetic radiation 81 undergoes a number of Doppler shifts, the specific number of Doppler shifts that a particular frequency must undergo to reach a desired or optimal electromagnetic radiation 85 may be calculated by observing certain mathematical formulas regarding Doppler effect in light. A number of variables may be determined to calculate $\Delta F$, which is the change in frequency that occurs with each Doppler shift (i.e. each interaction between directed electromagnetic radiation 81 and inner reflective surface 15 undergoes a change in frequency equal to $\Delta F$). Specifically, $\Delta F$ is the frequency of the source, Fs, minus the frequency of the listener, FL, ($\Delta F = Fs - FL$). The frequency of the source, Fs, is the frequency of the particular incident electromagnetic radiation 80, and may be known to those having skill in the art (See FIG. 2 for a table of typical frequencies of various colors of the spectrum). The frequency of the listener, FL, may be calculated by observing an equation:

$$FL = \sqrt{\frac{(c-v)}{(c+v)}} \times Fs$$

wherein c=speed of light (299,792,458 meters per second) and v=velocity of the light source moving towards the listener It should be understood that other formulas may be used to determine the frequency of the listener, and one having skill in the art may calculate a weighted average from each formula to determine the frequency of the listener. The velocity of the light source moving toward the listener, v, may be also be considered the speed of a vibrating atom. A typical atom vibrates at a speed of 1,117 meters per second (2500 miles per hour), but may vary considerably depending on, for example, temperature. Thus, in one embodiment, v may be plugged into the FL formula as 1,117 meters per second. Once all variables are known, $\Delta F$ may be calculated, and in many embodiments, $\Delta F = 2.4 \times 10^9$.

Next, calculating the number of Doppler shifts to be performed to reach the optimal (target) electromagnetic radiation 85 may be achieved by subtracting the source frequency, Fs, by the optimal (target) frequency, Fopt, and dividing the difference (Fs–Fopt) by $\Delta F$ ($2.4 \times 10^9$). For example, green light may have a source frequency, Fs, of $6.0 \times 10^{14}$ Hertz (or cycles per second), and assume the optimal (target) frequency, Fopt, is $4.5 \times 10^{14}$. Subtracting Fs ($6.0 \times 10^{14}$) by Fopt ($4.5 \times 10^{14}$), yields a difference of $1.5 \times 10^{14}$, which may be understood as the required amount of Doppler shift (as a frequency). The required amount of Doppler shifts may then be divided by $\Delta F$ ($2.4 \times 10^9$) to calculate the number of Doppler interactions/shifts. In the instant example, the number of Doppler shifts needed to reach the optimal (target) frequency, Fopt, is 66,964. FIG. 2 includes a table calculating the number of Doppler shifts for multiple frequencies on the visible electromagnetic spectrum, but it should be understood that the number of Doppler shifts may be calculated for frequencies other than visible light in accordance with the principles of the present invention.

Furthermore, the maximum speed in the vibration may occur when the atom is closest to equilibrium and stops at each end. The vibrating object must stop in each end of its vibration and reverse its direction. Thus, the meaningful useful portion of the vibration for a Doppler interaction may only occur during a center phase (high velocity) of the vibration. The center phase may also be split in half to reflect the fact that during one part of the cycle the atom is traveling in one direction, and during the second half of the cycle the atom may be traveling in the opposite direction. For example, to shift the frequency of directed electromagnetic radiation 81 in one direction, only approximately one-quarter of each vibration cycle may supply the useful velocity in the appropriate direction for the desired Doppler interaction. However, if there are at least two different optimal (target) frequencies, Fopt, and the source frequency, Fs, is between the optimal (target) frequencies, both halves of the center phase (high velocity) of the vibration cycle may be used. Moreover, when the vibration is in one direction, the Doppler shift may occur towards one desired frequency (i.e. a red shift) and when the atom vibrates in the opposite direction, the useful portion of the vibration cycle in the opposite direction may result in a converse Doppler shift (i.e. blue shift). However, if all of the optimal (target) frequencies, Fopt, are either below the source frequency, Fs, only one-quarter of the vibration cycle which supplies the useful velocity in the appropriate direction for the desired Doppler interaction may be used. In an alternate embodiment, both high velocity phases of the vibration may be utilized.

Figure 3:
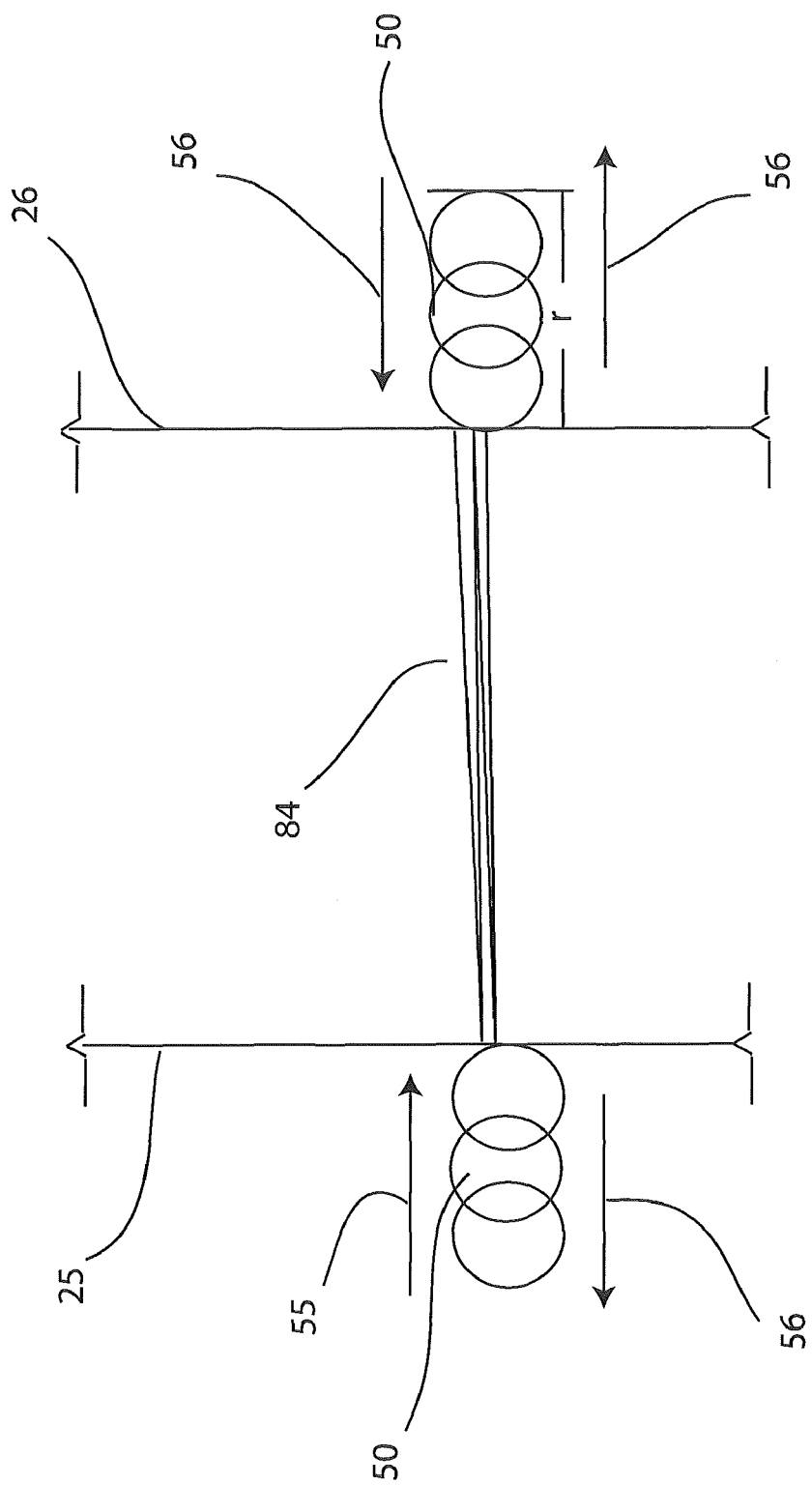
FIG. 3 depicts an enlarged cross section view of an embodiment of a vibrating atom of the side walls of the channel.
Figure 4:
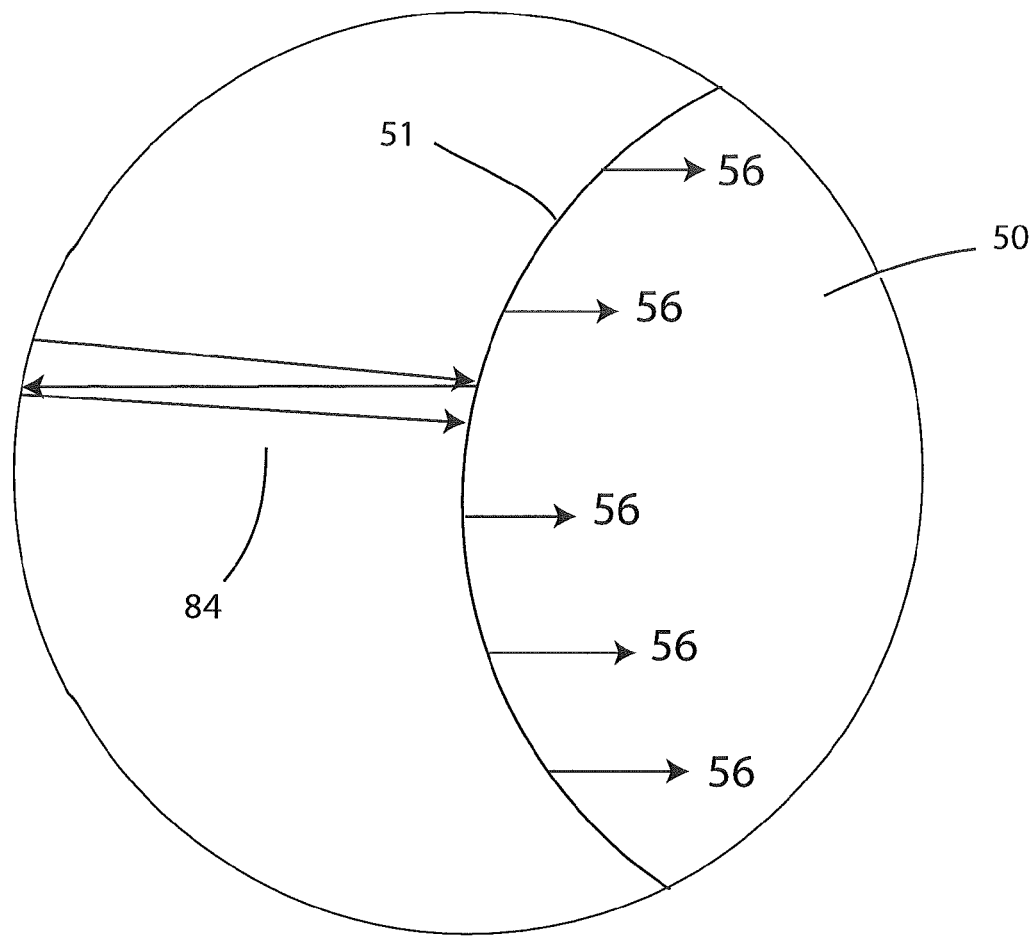
FIG. 4 depicts a magnified cross section view of an embodiment of a vibrating atom moving in an identical direction as the electromagnetic radiation.
Figure 5:
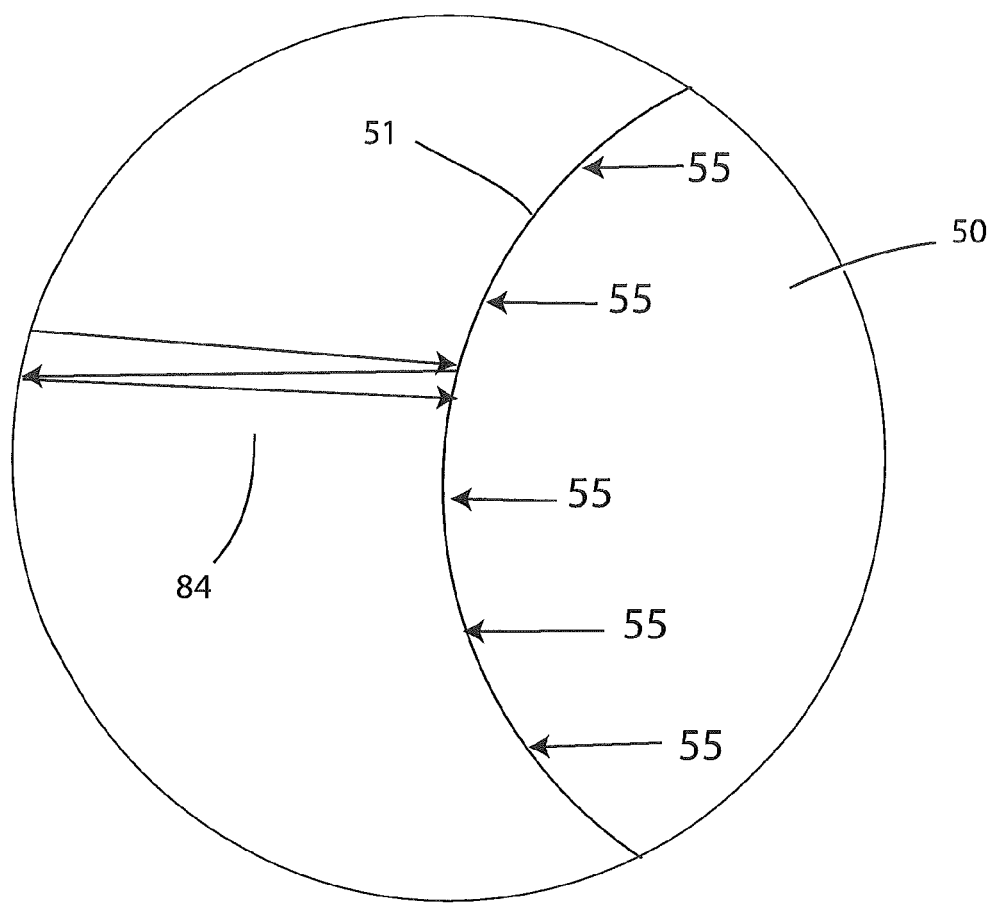
FIG. 5 depicts a magnified cross section view of an embodiment of a vibrating atom moving in the opposite direction as the electromagnetic radiation.

FIG. 3 depicts a portion of the channel 5, wherein a vibrating atom 50 of side wall 25, 26 has a vibrating range, r. The atoms of the plurality of crystals 17, or a single crystal, vibrate in directions 55, 56. When the reflected electromagnetic radiation 84 contacts the vibrating atom 50 moving in the same direction 56, a red shift occurs, and the frequency of the reflected electromagnetic radiation 84 is decreased (See FIG. 4). Conversely, if the reflected electromagnetic radiation 84 contacts the vibrating atom 50 moving in the opposite direction 55, a blue shift occurs, and the frequency of the reflected electromagnetic radiation 84 is increased (See FIG. 5). In one embodiment, the vibrations of multiple vibrating atoms 50 are synchronized.

Figure 6:
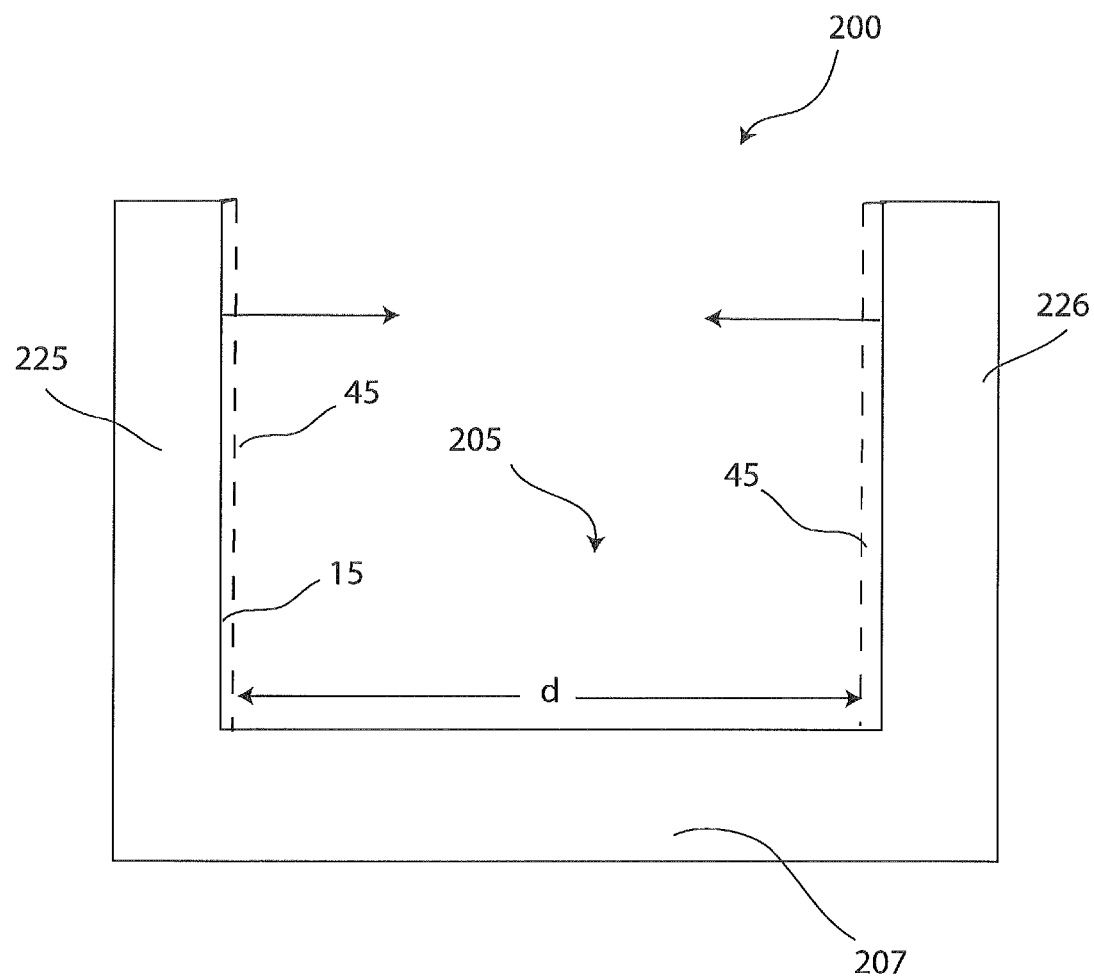
FIG. 6 depicts a top view of an embodiment of movement of the side walls when undergoing vibrations.

Referring now to FIG. 6, the channel 205 may be constructed such that side walls 225, 226 vibrate in an opposite phase of each other. For example, if the inside edge of side wall 225 is vibrating in one direction (e.g. to the right), then the opposite side wall 226 may vibrate in the opposite direction (e.g. to the left). This principle may be referred to as "synchronized-vibration" for the purposes of illustration and explanation of the following embodiments of the present invention.

Figure 11:
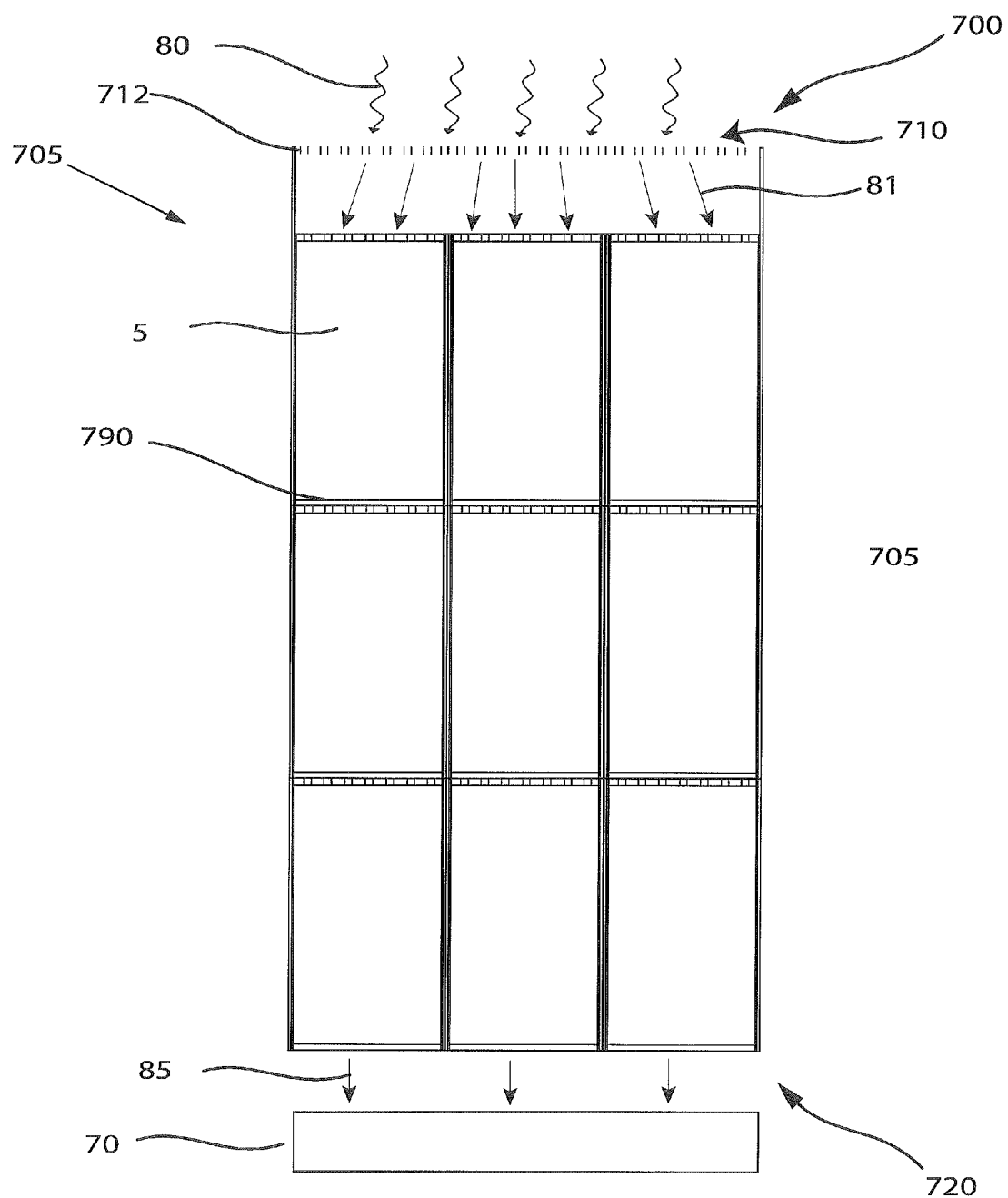
FIG. 11 depicts a cross section view of an embodiment of a plurality of channels in series and parallel.

In one embodiment, depicted in FIG. 6, the channel 205 may have two side walls 225, 226 constructed out of separate but identical crystal, which is capable of vibrating at high to ultrahigh frequencies to perform desired Doppler shifts. The crystal need not be exactly identical, but near as practicable to each other. The side walls 225, 226 may move toward each other, and simultaneously may move away from each other; the side walls 225, 226 vibrate in opposite phase to achieve "synchronized-vibration." The side walls 225, 226 may be constructed out of a rigid crystal, such as quartz, and rigid crystals may vibrate at certain resonant frequencies and harmonics. Placing two like-manufactured crystals, which comprise side walls 225, 226, in close proximity to each other, but not so close as to interfere with each other, when synchronized may vibrate in the same manner. Without any significant changes to the local environment surrounding side walls 225, 226, "synchronized-vibration" may occur. Once "synchronized-vibration" has been started, a harmonic may continue its harmonic motion indefinitely. Thus, to achieve a desired Doppler shift, each side wall 225, 226 may be placed a certain distance, d, apart from each other. In another embodiment, there may be an array of side walls 225, 226 placed in a series, as depicted in FIG. 11. Furthermore, the system 200 or array may be coated with a coating material 45 such as Plexiglas to strengthen or reinforce the system 200 or array. The coating material 45 may slow down the speed the speed of light through the channel 205, but the net effect may be negligible in terms of the construction of the device 200 and may strengthen the device 200, thereby increasing its durability and may lessen variations in the counter-phase synchronicity of the side walls 225, 226 caused by external influences.

Figure 7:
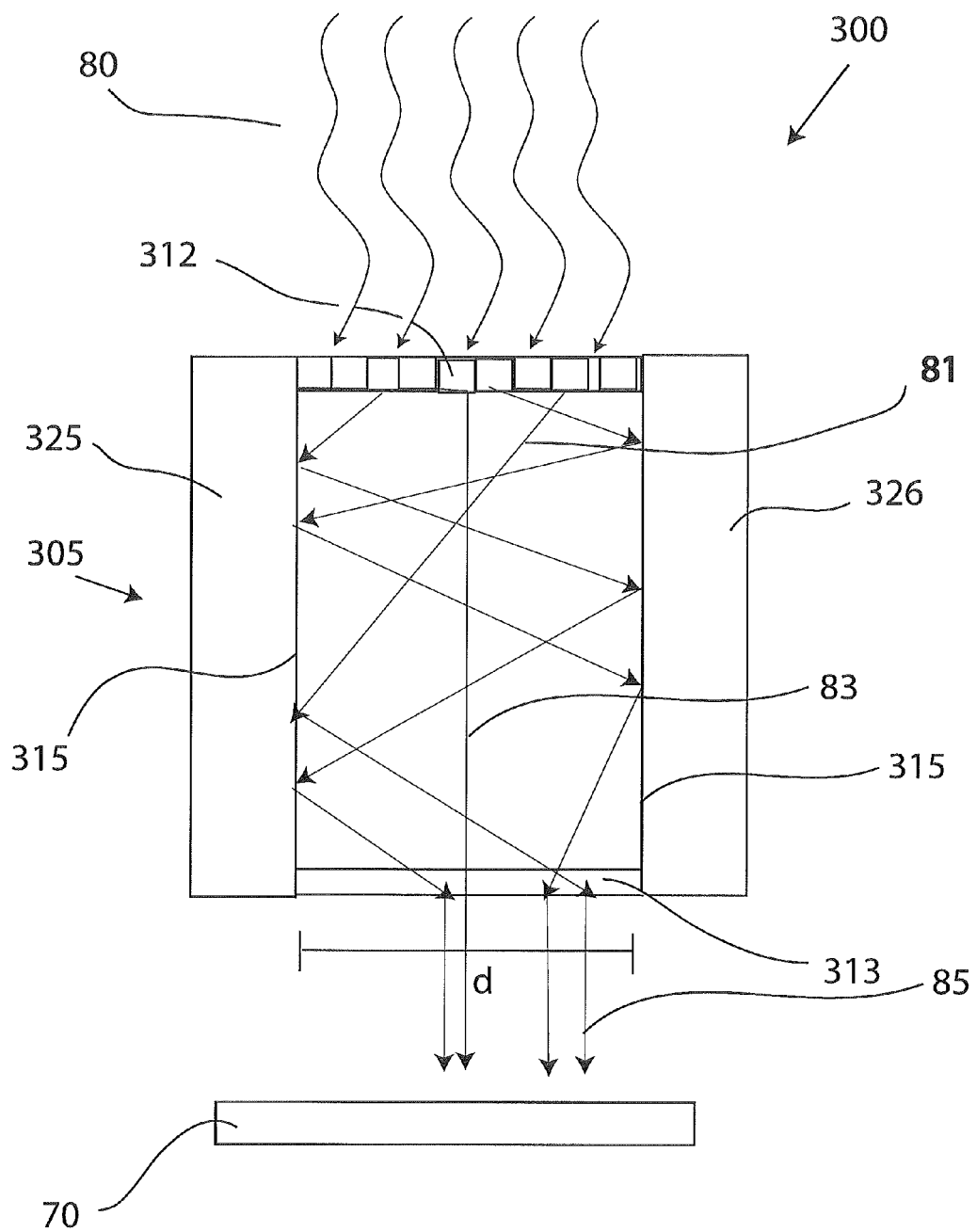
FIG. 7 depicts a cross-section view of an embodiment of an optimization device wherein no planar surface connects side walls.

Referring now to FIG. 7, side walls 325, 326 may not be connected to each by a planar surface 7, thus having two independent side walls 325, 326. Once the channel 305 is constructed, the crystals 315 may be tuned such that each crystal 315 may be vibrating in an opposite phase to the adjacent crystal. For example, the crystals 315 of side wall 325 may be configured and tuned to vibrate in one direction, and the crystals 315 of side wall 326 may be configured and tuned to vibrate in the opposite direction. In this manner, the two side walls 325, 326 may be both vibrating towards each other at the same time and opposite each other at the same time ("synchronized-vibration"). Initially starting the crystals 315 to vibrate in a given pattern may be done by methods known to those skilled in the art. Because the adjacent crystals of side walls 325, 326 may be in the same environment, subject to the same temperature variations, shocks, and like trauma, the net effect may be that the crystals 315 continue with their harmonic vibrations in the same out of phase manner as initially set relative to each other. For example, if one crystal 315 changes in frequency, all of the adjoining crystals may suffer the same trauma, and may change in the same manner. The harmonic properties of the crystals 315 will lessen the possibility of gradual degradation of the counter-synchronicity of the adjoining crystals once set. Moreover, it is understood that the crystals 315 may be reset, and during this time maintenance may be performed on the system 300, including but not limited to repair and cleaning.

Returning to the previous example calculating the number of Doppler shifts required to reach the optimal (target) frequency, Fopt, for green light, the number of Doppler shifts required is approximately 66,964. In an embodiment of device 300, the 66,964 Doppler shifts may be accomplished in $1/10^{th}$ of $1/4$ of a cycle. More particularly, if the atoms vibrate at 30,000 hertz, the time frame to perform a Doppler shift may be one-quarter of one vibrating cycle. Based on the useful one-quarter cycle, there is approximately 120 thousandths or 0.00000833 seconds ($8.33 \times 10^{-6}$) of useful time. In this amount of useful time, light traveling at 299,792,458 meters per second may travel 2,498 meters. During the useful phase of a single cycle there may be a total distance of 249,827 centimeters distance for light to travel during which the useful cycle occurs. Therefore, if side walls 325, 326 are placed apart from each other a distance, d, of 0.373 centimeters, 66,964 Doppler shifts may occur in $1/10^{th}$ of the $1/4^{th}$ of the useful cycle, and the incident green light has been optimized to reach the optimal (target) electromagnetic radiation 85.

With continued reference to FIG. 7, the height of the side walls 325, 326 may be set to varying heights, and no particular height may be required. It is understood that a channel 305 may be on a nanoscale, and may be configured to operate with various nanotechnology and the like. The only limiting criteria of the channel 305 may be the distance, d, between side walls 325, 326 to eliminate any interference with the vibrations of each side wall 325, 326.

Figure 8A:
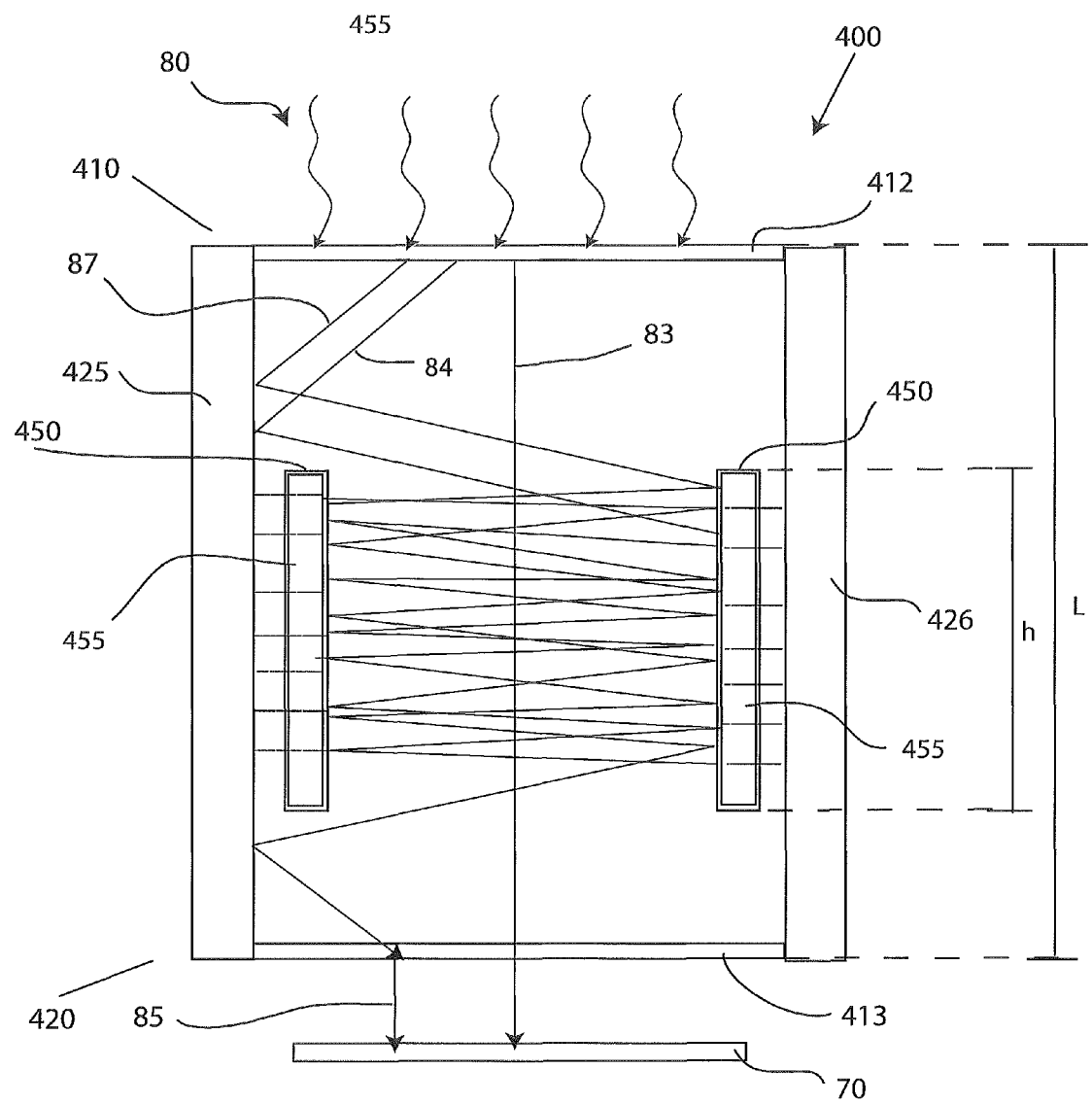
FIG. 8A depicts a cross-section view of an embodiment of an optimization device with a pair of minors placed between the side walls.
Figure 8B:
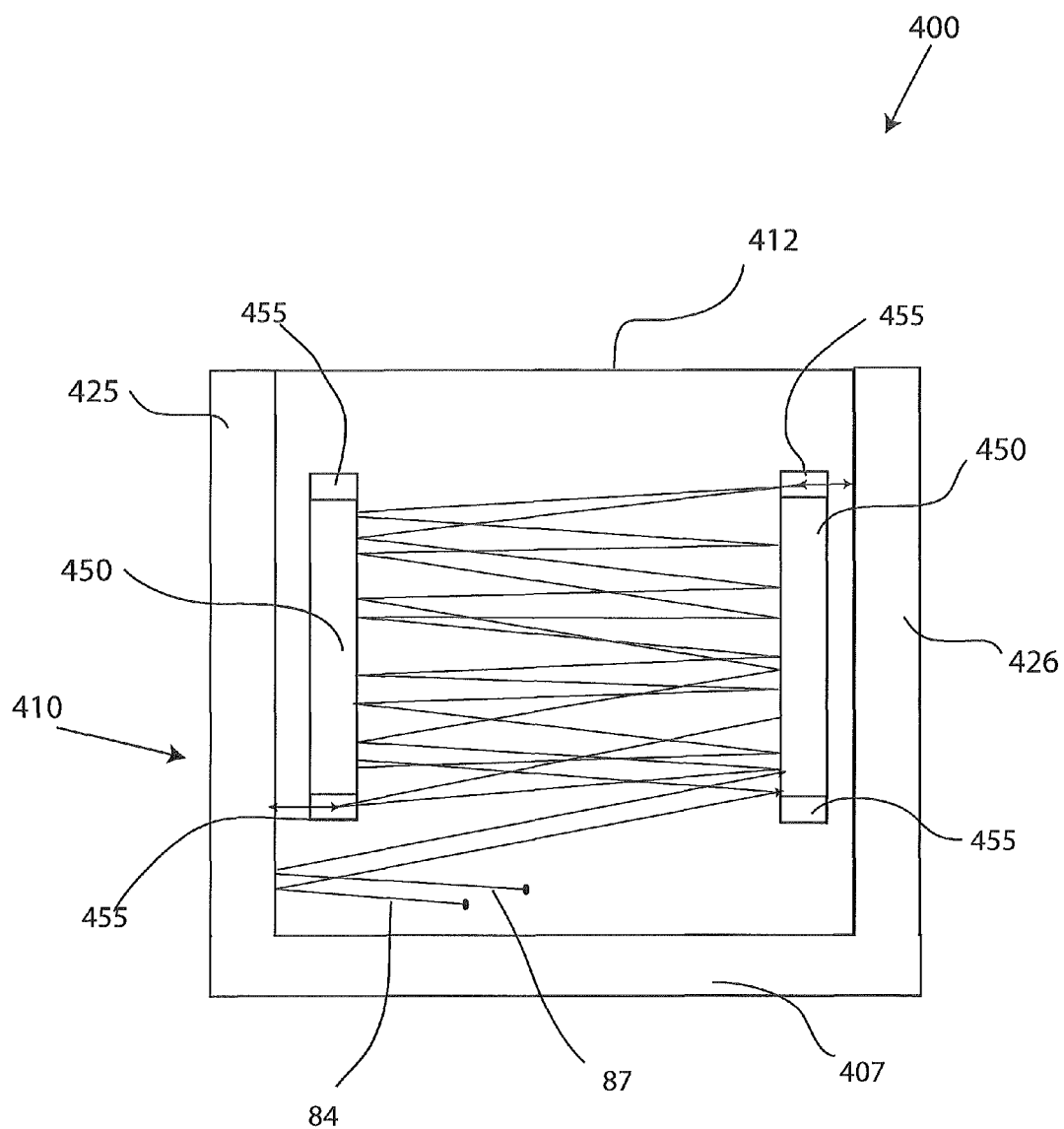
FIG. 8B depicts a top view of an embodiment of an optimization device with a pair of minors placed between the side walls.

FIGS. 8A and 8B. depict an embodiment of an optimization device 400 having a time/distance extender 450 located proximate to side walls 425, 426. Because the channel 405 may only utilize one-quarter of the incident electromagnetic radiation 80, it may be desirable to recycle the incident electromagnetic radiation 80 that is not used. The unused electromagnetic radiation may be called waste electromagnetic radiation 87. One possible way to recycle waste electromagnetic radiation 87 may be to construct a time/distance extender (TDE) 450. More than one TDE 450 may be used in a given channel 405, and may face each other to facilitate repeated reflection. The TDE 450 may be a gap with mirrors or a reflective material at each end of the gap with a lens 455 at each end of the reflective material that may allow light which has not been directed to the target, to be reflected between the minors for a sufficient amount of time approximately equal to the amount necessary so that the side walls 425, 426 have passed through a partial phase of a vibration cycle. After a delay, the otherwise waste electromagnetic radiation 87 may be redirected to the first end 410 of optimization device 400 or towards the side walls 425 and 426 the lenses 455 may direct the waste electromagnetic radiation 87 in the TDE 450 to the side wall where the Doppler shift occurs and the waste electromagnetic radiation 87 may then be reflected back through the TDE 450 to the opposite side wall. After sufficient Doppler interactions, the TDE 450 may be bypassed and the waste electromagnetic radiation 87 may be directed to either the target 70 or thereafter recycled to the first end 410, or directed through another channel 405 in series or succession. Thus, the waste electromagnetic radiation 87 may be repeatedly recycled until it passes through the channel 405 at an optimal phase such that a desired frequency may be obtained. In this manner, the waste electromagnetic radiation 87 which may not be otherwise be utilized because it did not pass through the channel 405 during a useful velocity vibration phase, may be time delayed until it passes through the channel 405 during a useful velocity vibration phase. With the use of a TDE 450, up to half of the available light may be utilized. For example, if a lower frequency is sought, then in such case, the light which is Doppler shifted to a lower frequency and the light which pass through the channel 405 during the low velocity vibration phase which was just prior to the downward conversion Doppler shift phase may be utilized.

Although waste electromagnetic radiation 87 may be recycled with the use of the TDE 450, incident electromagnetic radiation 80 may also enter the channel 405 and reflect through the TDE 450 as shown by FIGS. 8A and 8B. The incident electromagnetic radiation 80 may enter the channel 405 and reflect off one of the side walls 425, 426 and contact one of the mirrors of the TDE 450. Once the incident electromagnetic radiation 80 enters the channel 405 and interacts with side wall 425 or side wall 426, it may be referred to as reflected electromagnetic radiation 84. The reflected electromagnetic radiation 84 may reflect back and forth within the TDE 450 moving in both a horizontal and vertical direction through the channel 405. While moving horizontally, the reflected electromagnetic radiation 84 may pass through one of the lens 455. In many embodiments, there may be four lens 455, but there may also be only two lens 455. Lens 455 may change the angle of reflection and direct the reflected electromagnetic radiation 84 at approximately a 90° towards a side wall 425, 426. The side wall 425, 426 may then reflect the reflected electromagnetic radiation 84 perpendicularly back through lens 455, which may again change the angle of reflection, angling the reflected electromagnetic radiation 84 back towards the mirrors of the TDE 450. Thus, the electromagnetic radiation 84 moves horizontally to one edge of the TDE 450 until it contacts the lens 455, wherein it may reverse its course and move horizontally towards the opposite edge of the TDE 450 until it contacts the opposing lens 455. Simultaneously, the reflected electromagnetic radiation 84 may be moving vertically down the channel 405 towards the second end 420. This process may continue until the reflected electromagnetic radiation 84 has moved vertically down the channel 405 a sufficient distance where the TDE 450 mirror substrate no longer extend. In other words, the TDE 450 may be dimensioned to have a shorter height, h, than the height, L, of the side walls 425, 426, as depicted in FIG. 8A.

Figure 9:
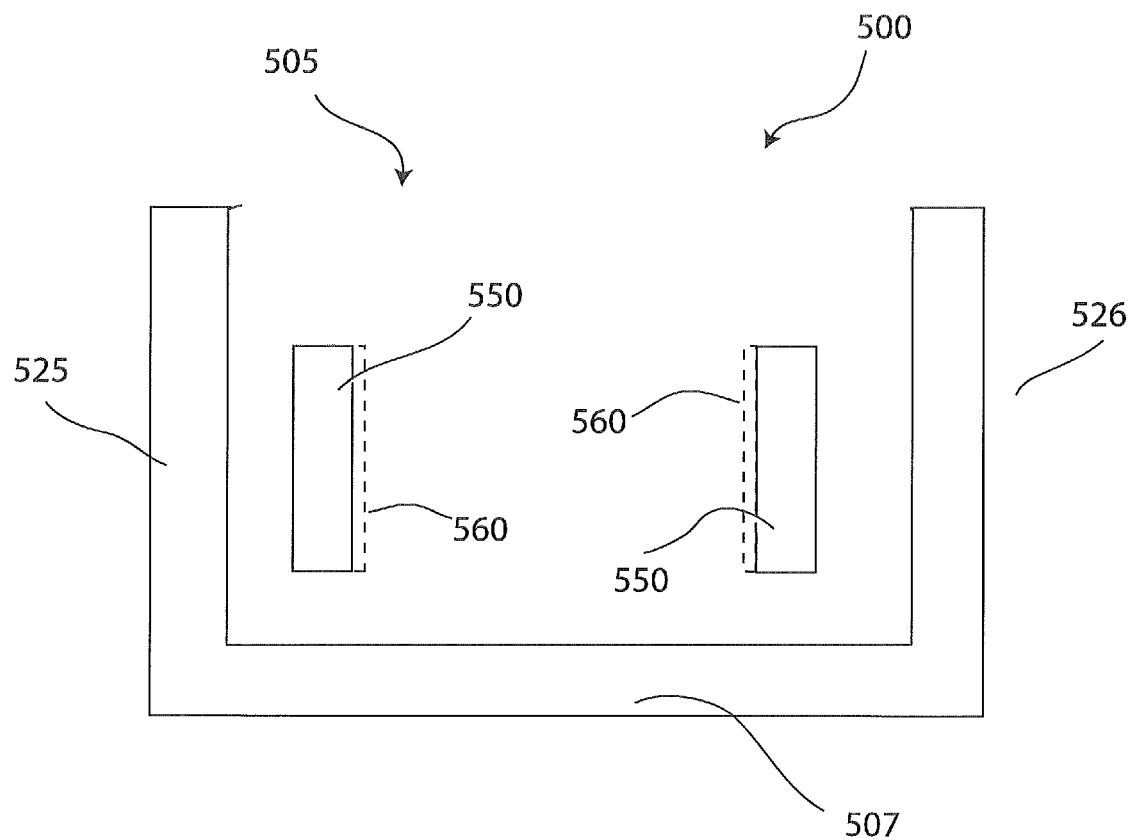
FIG. 9 depicts a cross section view of an embodiment of an optimization device, wherein a single crystal structure is used.

FIG. 9 depicts a channel 505 whereby a single crystal is implemented. The single crystal comprising both side walls 525, 526, may act as a standing wave, and the entire crystal may vibrate consistently. For example a single crystal may be in the shape of a tuning fork, whereby each prong of the tuning fork may comprise a side wall 525, 526; the vibrating relationship between two points on the inside of the tuning fork design may be consistent. For example, all points on the single crystal may move at the same time. Based on this consistent movement of the single crystal in the shape of a tuning fork, when the right inside edge of the left fork moves to the left, the left inside edge of the right fork also moves to the left. In accordance with the calculations discussed supra, to obtain a Doppler shift, the inside edge of the opposite side of the fork to be out of phase by one-half cycle. Furthermore, to obtain the desired Doppler shift as the directed incident electromagnetic radiation 82 reflects off each of the inside edges of the channel 505, it may be necessary to cause the space between the two inside edges of the channel 505 to be such that when the directed incident electromagnetic radiation 82 travels from one inside edge to the opposite inside edge, the opposite inside edge is one-half of a cycle out of phase to the prior edge.

To shorten the distance, d, between each of the side walls 525, 526, a time/distance extender (TDE) 550 may be inserted between the side walls 525, 526 of the channel 505. TDE 550 may be a device that, in effect, holds the light for a given period of time. The TDE 550 may be a gap with opposing planar surfaces covered by a reflective surface such as a mirror and lenses 555 at each end so as to direct the waste electromagnetic radiation 87 and/or reflected electromagnetic radiation 84 in the TDE 550 to the side wall 525 where the Doppler shift occurs and the waste electromagnetic radiation 87 and/or reflected electromagnetic radiation 84 may then be reflected back through the TDE 550. More than one TDE 550 may be used in a given channel 505, and may face each other to facilitate repeated reflection. The TDE 550 may also cause the directed electromagnetic radiation 81 to reflect between its mirrors numerous times so as to create a delay in time. However, after the light has traveled a considerable distance (back and forth in the TDE), the light may be directed back towards the first end 510 of the channel 505, or may be directed to an inside edge of the channel 505 to undergo a Doppler shift. In an exemplary embodiment, there is no TDE medium 560 between the more than one TDE 550. In another embodiment, a TDE medium 560 with a high index of refraction may be positioned between the more than one TDE 550 to add structural support and to lessen the need to execute many reflections. For example, a TDE medium 560 with a high index of refraction may slow the speed of light which may lessen the distance the light needs to travel.

To determine the distance, $d_1$, between each TDE 550, consider that the atoms vibrate at 30,000 hertz, and the time frame to perform a Doppler shift may be one-quarter of one vibrating cycle. If a TDE medium 560 made out of Plexiglas, which has an index of refraction of 1.51, is placed between two TDE 550, and the distance, $d_1$, between the TDEs 550 is 3.3 centimeters, the light may reflect 100,000 times in the TDE 550 before it hits one of the side walls 525, 526. The number of reflections may be calculated as follows: refraction index (e.g. 1.51 for Plexiglas) divided into the speed of light (i.e. 299,792,458 meters per second) equals a net speed (i.e. 198,538.51 meters per second).

However, other materials may be used as a TDE medium 560. For example, a TDE medium 560 made of silicon may be used, which has a refraction index of 4.0. The higher the index of refraction of the TDE medium 560, the lower the effective speed of light. For example, if silicon is used as the TDE medium 560, the net effective speed of light may be reduced to approximately 74,948,114 meters per second. The net effective speed may be multiplied by the length of time which passes in one-half cycle; the light would then need to travel only 1,249 meters to result in a delay of one-half cycle. Thus, if 100,000 reflections between the TDEs 550 were desired, the distance, $d_1$, may be approximately 1.25 centimeters. However, if the distance, $d_1$, remained at 3.33 centimeters, then the amount of reflections may only be approximately 37,357 in the TDE 550. In yet another non-limiting example, if incident green light needed to be shifted to red light (target frequency), and the number of required Doppler shifts may be 66,964, the total amount of time to create the shift may be 1.116 seconds.

Figure 10:
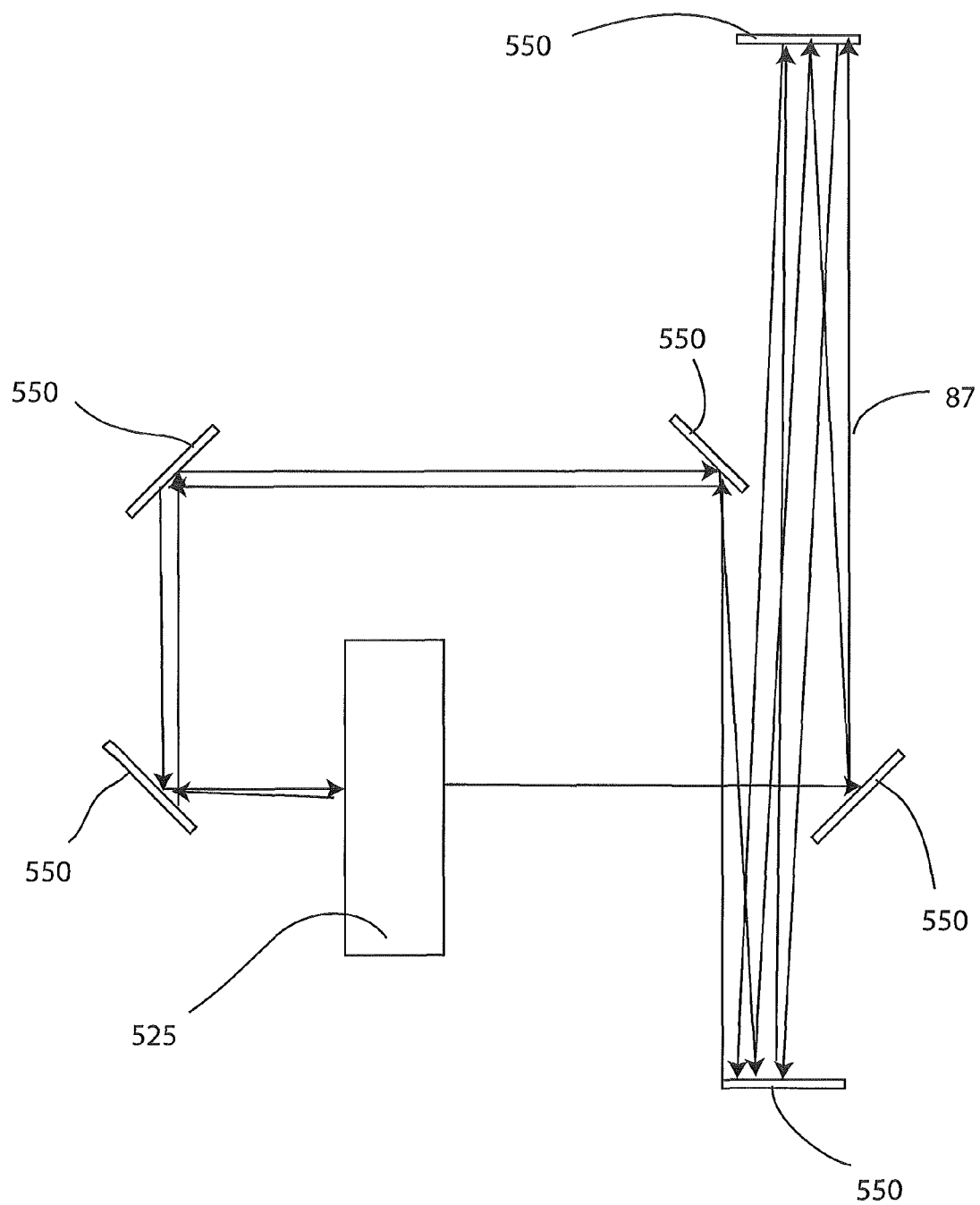
FIG. 10 depicts a cross section view of an embodiment of an optimization device wherein a dual use, single crystal is used.

FIG. 10 depicts a Dual Use Single Crystal Solution (DUSCS). DUSCS may utilize both sides of a single independent crystal as the inside of side walls 625, 626 of the channel 605. In this manner, a single, vibrating crystal may create all the vibrations necessary for the Doppler interactions. The DUSCS may eliminate the need to synchronize the vibrations of an independent crystal, and may eliminate the need to implement a large crystal. The DUSCS may function by having incident electromagnetic radiation 80 vibrate off one side of a vibrating crystal, and then subsequently direct the directed electromagnetic radiation 81 towards a time distance extender 650. After the requisite delay, the time distance extender 650 directs the directed electromagnetic radiation 81 towards the opposite side of the single, vibrating crystal. This may occur after one-half of the vibration cycle has passed. Accordingly, the Doppler interactions may always be synchronized because the DUSCS uses the same, vibrating crystal; there also may not be any phase issues.

Furthermore, the time distance extender 650 may not have to be placed between the "forks" of a single crystal because DUSCS employs a single, solid crystal. Thus, the TDE 650 may be constructed having opposing mirrors separated by a distance, $d_1$, approximately equal to the length or width of the optimization device 600. In one embodiment, the optimization device may be created using one-half meter panels, and the distance, $d_1$, between the mirrors attached to the TDEs 650 may be approximately 50 centimeters. Moreover, if a TDE medium 660, such as Plexiglas is placed between the TDEs 660, only 6,618 reflections may be necessary to result in a one-half cycle time delay if the crystal is vibrating at 30,000 hertz. A further advantage of DUSCS may be that DUSCS greatly simplifies the needed accuracy in setting the reflection angles in the TDE 660, and it may also lessen the losses which may occur upon each reflection. In addition, another TDE 660 may be utilized as a delay so as to recycle the incident electromagnetic radiation 80 which passes through one-quarter of the channel 605 when the vibration speed is insufficient to provide a beneficial Doppler interaction and achieve the optimal frequency.

With continued reference to FIG. 10, the crystal may be any size which is optimal for manufacturing purposes, and the channel 605 may be constructed in accordance with the dimensions of the crystal. For example, the crystal may be 0.01 cm in height, 0.001 cm in width, and 1.0 cm in length.

FIG. 11 depicts a plurality of channels 705 used in series and/or parallel order to form an array of Doppler channels 705 to achieve optimal Doppler shifting capability. The array of channels 705 may be the same approximate structure as channel 5 having a first end 710 and a second end 720, but not all channels 5 may have a focusing member 13. Instead, the directed electromagnetic radiation 81 may travel directly through a transparent structural member 790 and into a successive separating member 712 of another, proximately located, Doppler Channel 5. Therefore, in an array of Doppler channels 705 array, each channel 5 and subsequent Doppler channel(s) to which it may be connected may be calculated or tuned to receive and perform a Doppler shift to a particular range of frequencies. For example, when a channel 5 is tuned to either red shift or blue shift to a particular range of frequencies, incident electromagnetic radiation 80 entering the separating member 712 are separated according to the frequencies for which each channel 5 is intended. The separating member 712 may direct the directed electromagnetic radiation 81 to the series or array of Doppler channels 705 tuned specifically to shift and optimize those particular frequencies. Finally, optimized electromagnetic radiation 85 is produced and may be focused onto a target, wherein the target may operate more efficiently as a result of the increased amount of optimal electromagnetic radiation 85 contacting the target. In one exemplary embodiment, the target may be a photovoltaic material.

Figure 12:
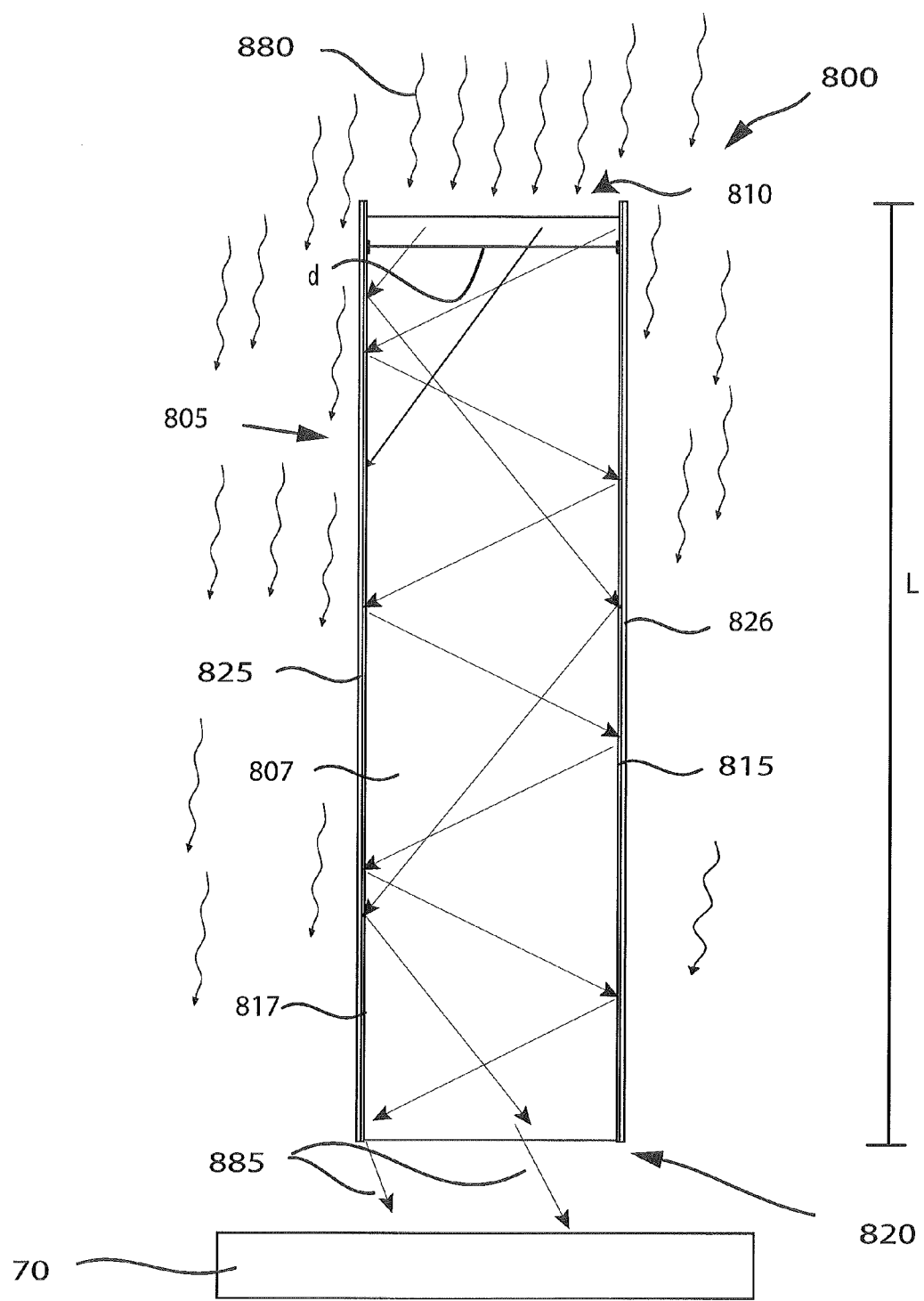
FIG. 12 depicts a cross-section view of an embodiment of an ambient heat conversion device.
Figure 3:
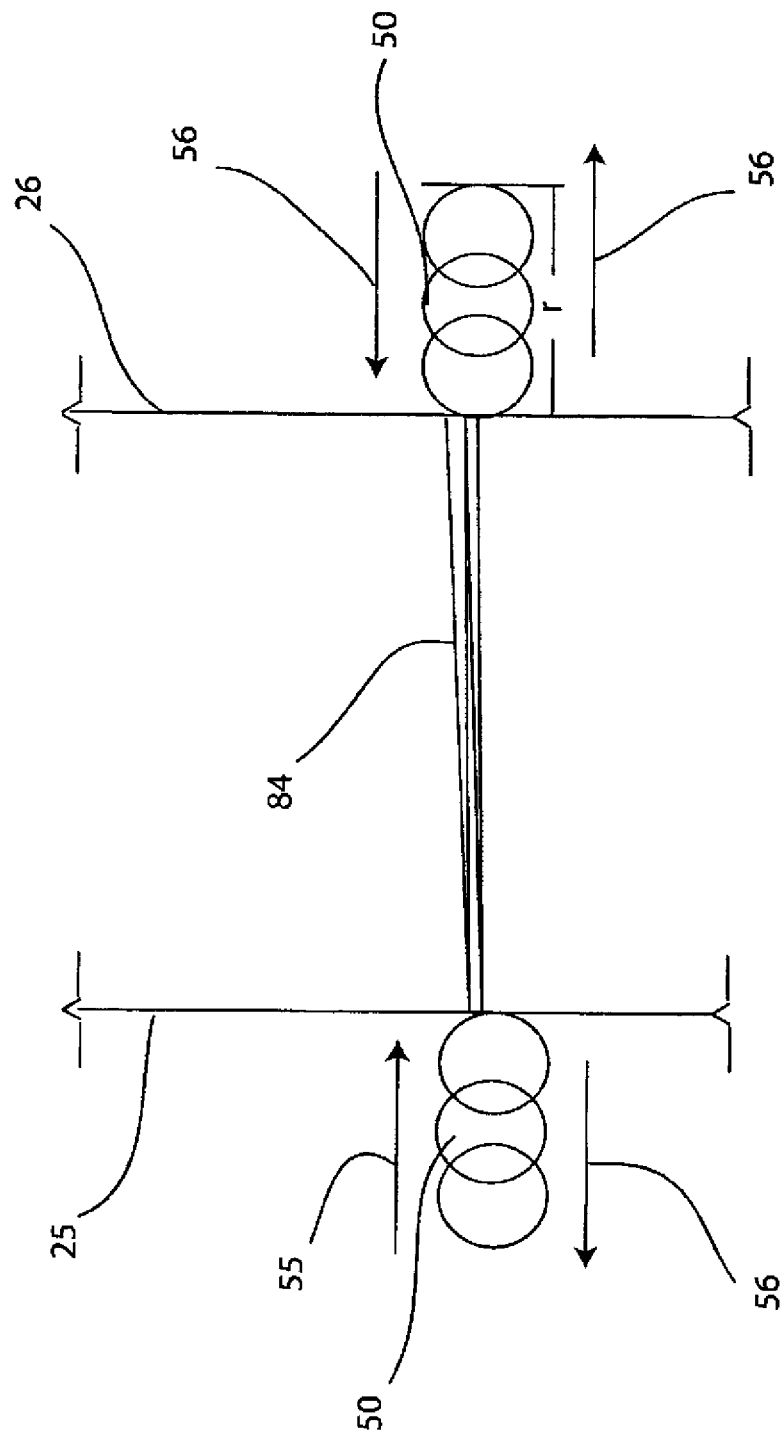
Figure 4:
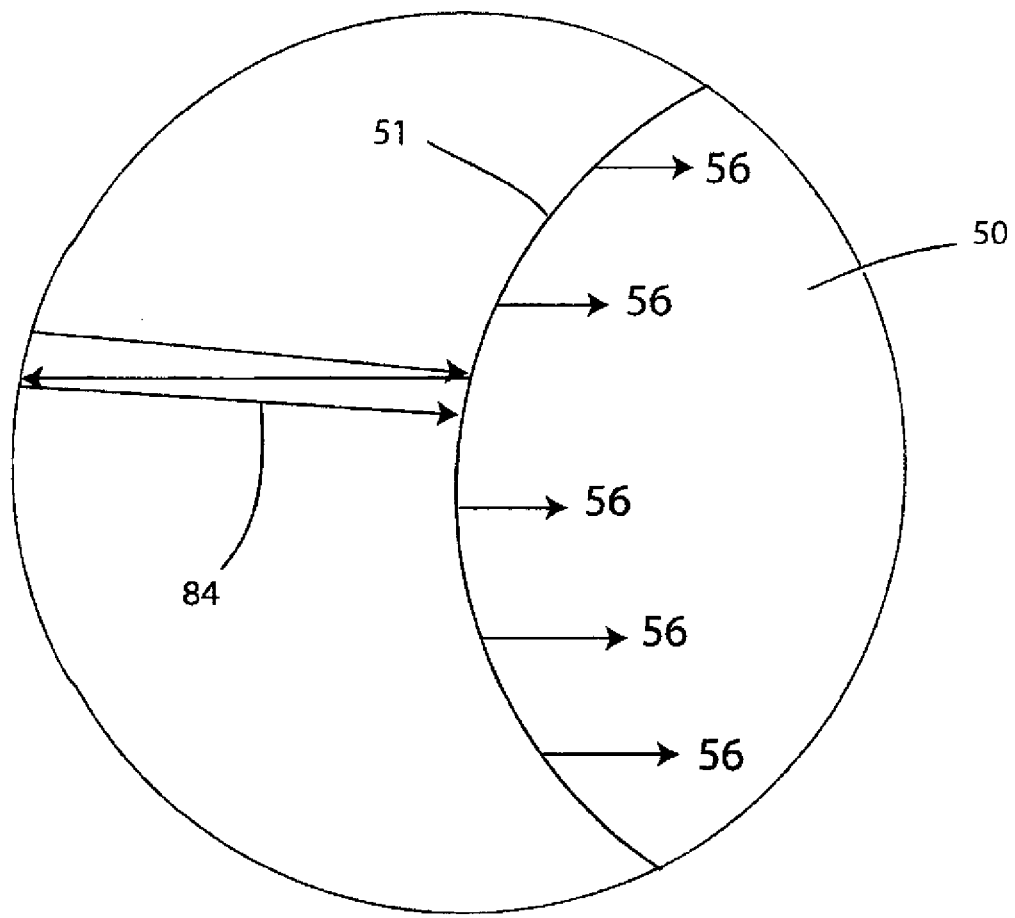
Figure 5:
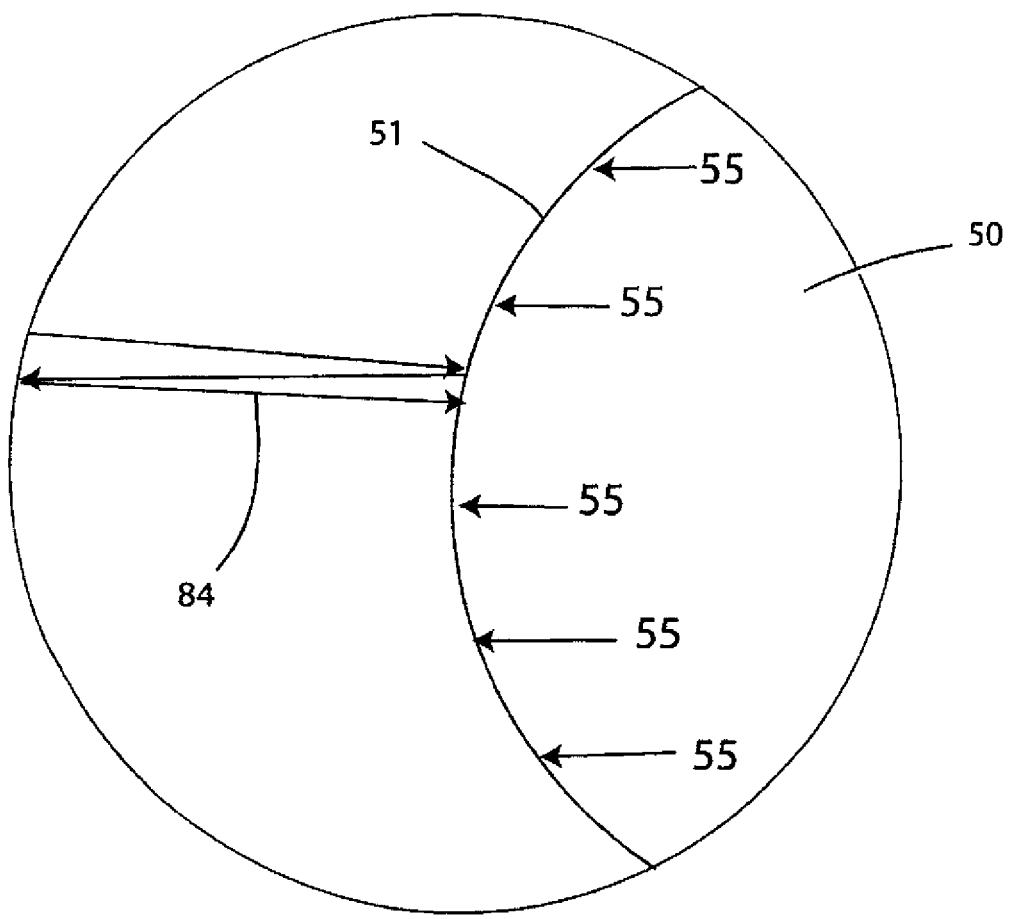
Figure 7:
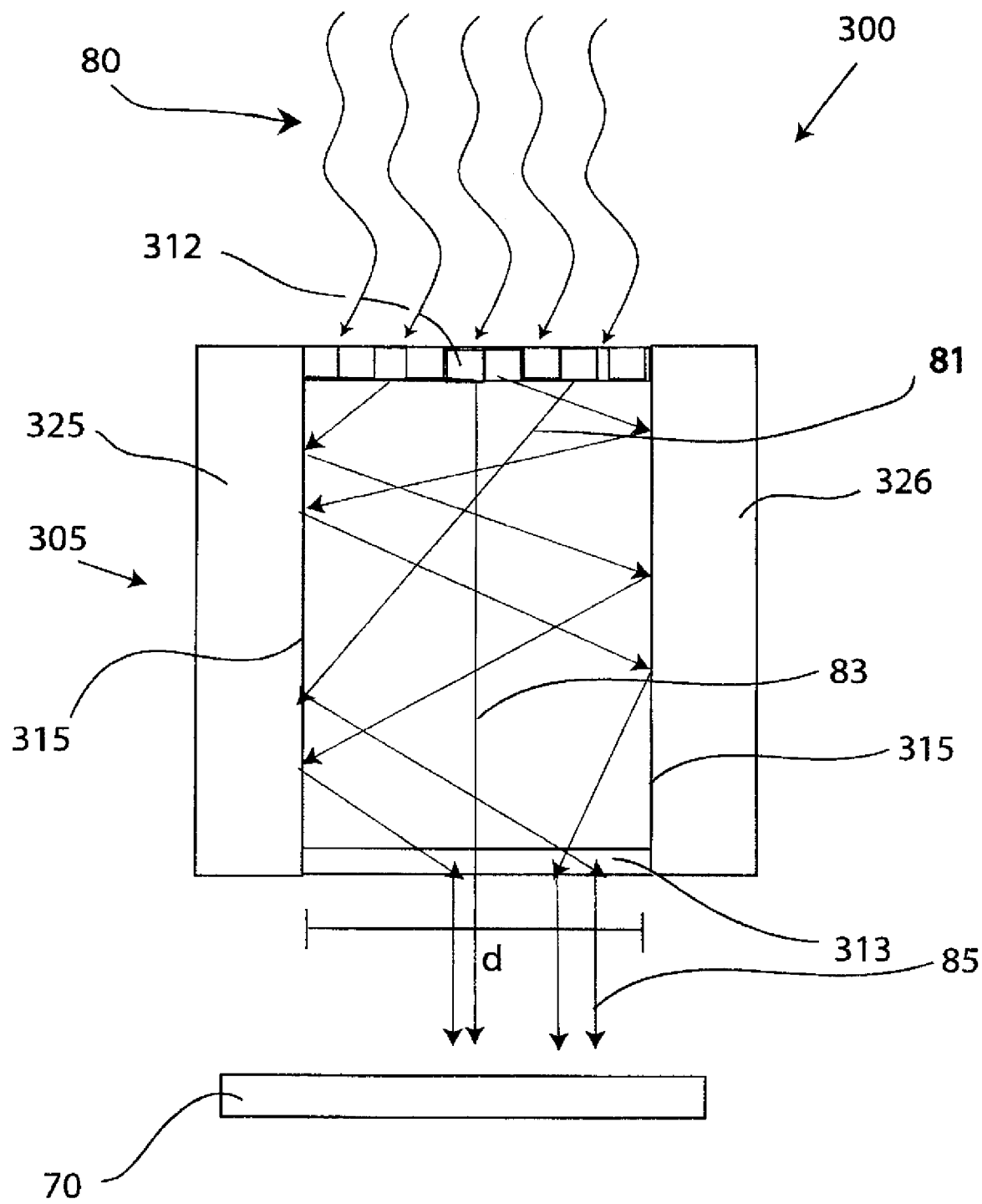
Figure 8A:
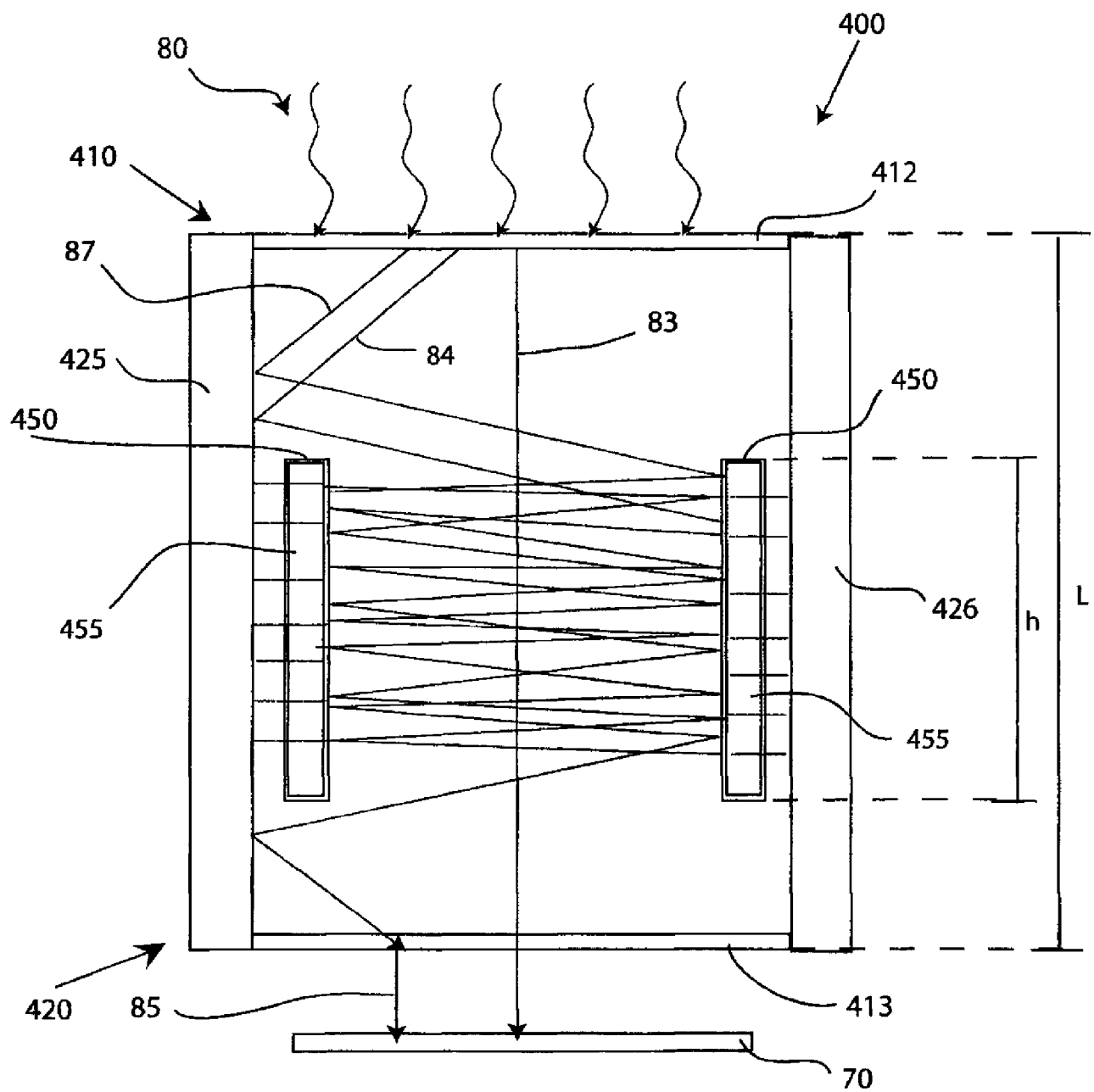
Figure 9:
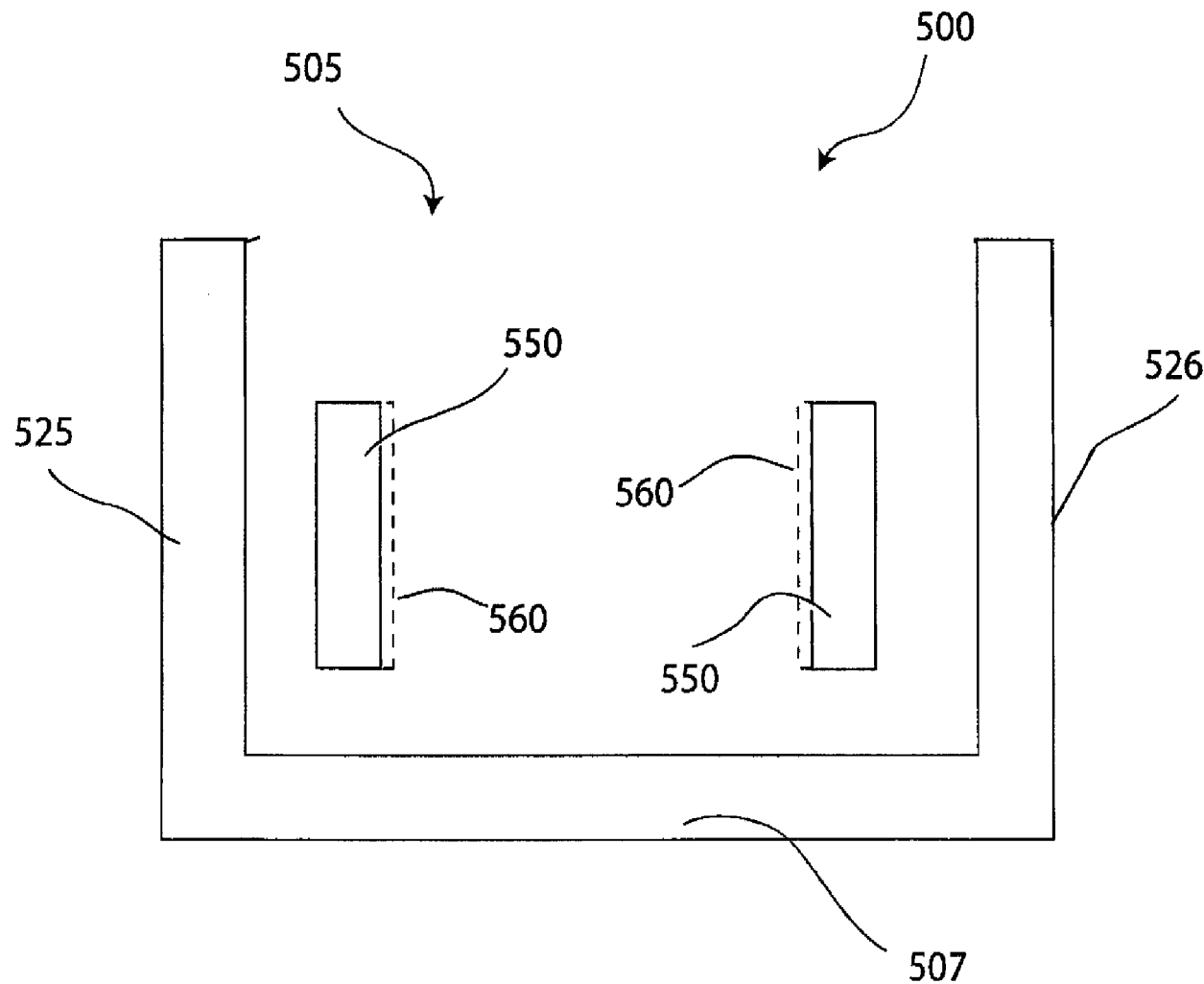
Figure 11:
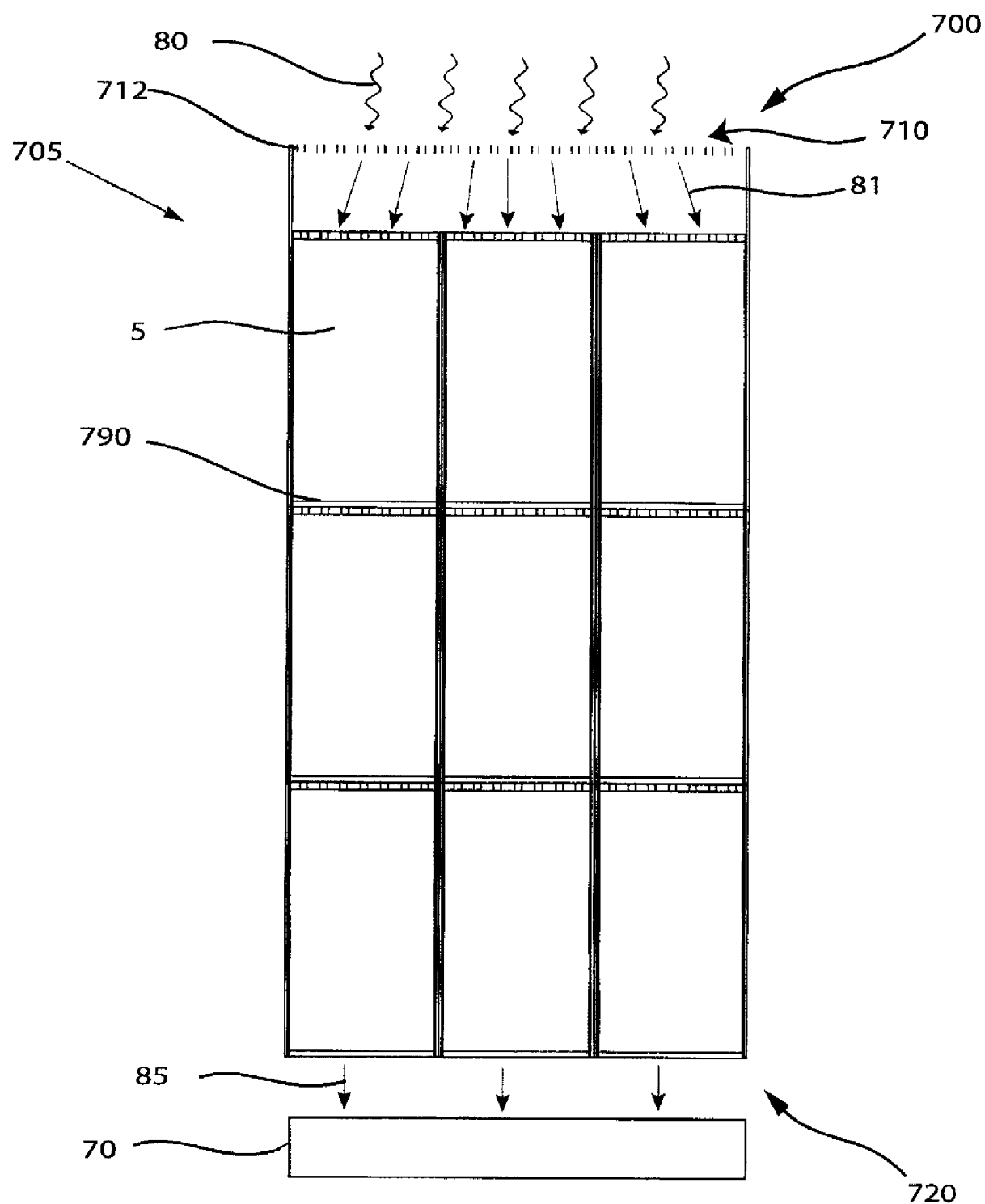

Referring now to FIG. 12, with general reference to FIGS. 1-11, an embodiment of a ambient heat conversion device 800 is described. Components such as a planar surface 807, a crystal(s) 817, reflective surface 815, and at least two opposing walls 825, 826 may share the same or substantially the same structure and functions as planar surface 7, crystals (and atoms 50), and the side walls 25, 26 described supra with respect to other embodiments. However, embodiments of ambient heat conversion device 800 may have a conversion channel 805, the conversion channel 805 may include a first end 810, a second end 820, at least two side walls 825, 826. Other embodiments of ambient heat conversion device 800 may include a conversion channel 805 including: a first end 810 configured to accept ambient electromagnetic radiation 880, the ambient electromagnetic radiation 880 having an initial frequency, $F_I$, a second end 820 configured to allow the ambient electromagnetic radiation 880 to exit, and at least two opposing walls 825, 826 connecting the first end 810 and the second end 820, wherein the at least two opposing walls 825, 826 include one or more crystals, the at least two opposing walls 825, 826 being separated by at least one-half of a wave length; wherein when the ambient electromagnetic radiation 880 interacts with the one or more crystals of the at least two opposing side walls 825, 826, the initial frequency, $F_I$, of the ambient electromagnetic radiation 880 being repeatedly increased to an optimal frequency, $F_{OPT}$. Further embodiments of conversion device 800 may include a first side wall 825 and a second side wall 826 forming a conversion channel 805, the conversion channel 805 having a first end 810 and a second end 820, wherein the first side wall 825 is constructed out of one or more crystals and the second side wall 826 is a reflective surface; wherein the conversion channel 805 captures ambient infrared radiation 880 having an initial frequency, $F_I$, from an environment proximate the first end 810, and repeatedly increases the initial frequency, $F_I$, to an optimal frequency, $F_{opt}$, through a plurality of interactions between the ambient infrared radiation 880 and at least one atom 50 of one or more crystals making up the first side wall 825, further wherein the at least one atom 50 is moving toward the incoming infrared radiation 880 during a single interaction.

The ambient heat conversion device 800 follows the scientific principle that when electromagnetic radiation reflects off a moving object, the frequency of the reflected radiation becomes wither high (i.e. blue shifted) or lower (i.e. red shifted), depending on the relative speed of the object towards the light source. If an object, such as an atom 50 of a crystal in a side wall 825, 826, is moving toward the light source, such as ambient electromagnetic radiation 880, the frequency may become higher (i.e. blue shifted). The one or more crystals used in conversion device 800 may include Silicon, $SiO_2$, $LiNbO_3$, GaAs, GeAsSe, $BaF_2$, ZnSe, ZnS, $Al_2O_3$, ceramics, metals, carbon, diamond, beryllium, iron, brass, copper, tin, nickel, chromium, magnesium, barium titanate, zinc sulphide, tourmaline, hydrogen phosphate, magnesium oxide, silicon nitrate, silicon carbon, hafnium, reflective gas, reflective liquid, or any combinations or mixtures thereof.

Ambient heat, ambient electromagnetic radiation, ambient infrared radiation, and the like, may not always have an initial frequency, $F_I$, high enough to meet a threshold to produce, or be converted into electricity. Thus, conversion device 800 may repeatedly upshift, or blueshift, the ambient electromagnetic radiation 880 through repeated Doppler interactions within the conversion device 800 until the resulting frequency is high enough so that electricity will be produced when the blueshifted radiation interacts with a target 70, such as a photovoltaic device. For example, the initial frequency, $F_I$, of ambient electromagnetic radiation 880 may need to be increased to $4.1 \times 10^{14}$ Hz. The resultant radiation, or the blueshifted radiation that interacts with a target 70 may be referred to as optimal radiation 885, and may have an optimal frequency, $F_{OPT}$. Generally, the difficulty in producing/causing the required blue shift is that the energy required to achieve the speeds/velocity necessary to obtain such a Doppler shift (e.g. blue shift) may greatly exceed any useful energy which might thereby be produced. Thus, the conversion device 800 can solve this problem by harnessing the movements or vibrations of matter (e.g. movements and/or vibrations of the crystal atoms 50 in a side wall 825, 826) which may naturally occur in a non-zero temperature environment. For instance, the conversion device 800 may utilize the vibration movement which already exists or takes place in various environments. To the extent heat energy is converted into electricity, the ambient heat energy replaces the loss; accordingly, the conversion device 800 may utilize an unlimited source of "free" energy anywhere on the planet.

Moreover, the conversion device 800 may be designed to obtain numerous Doppler shifts during a single favorable vibration phase of an atom, such as a crystal atom 50. If the initial frequency, $F_I$, of ambient electromagnetic radiation 880 are high enough and if vibration speeds/velocity are fast enough, it may be possible that all Doppler interactions can occur during a single vibration phase of an atom, and may eliminate a need for a time distance extender, such as TDE 450, 550, 650. Examples of this situation may be co-generation environments wherein "waste" heat is generated, such as in nuclear and fossil fuel power plants, in high temperature industrial processes, or engine compartments. Thus, embodiments of conversion device 800 may harvest electricity from waste, or unused emitted heat/energy.

Referring still to FIG. 12, the ambient, or background, electromagnetic radiation 880, such as infrared radiation, may be captured, collected, accepted, etc., proximate the first end 810 of the device 800. The first end 810 of the device may also be referred to as an input end. At the input end, or first end 810, of the device, the ambient electromagnetic radiation 880 may also be focused and directed into the channel 805. However, in many embodiments, the conversion device 800 need not direct the radiation 880 through a frequency splitter proximate the first end 810 because the ambient temperature and the frequency may be relatively consistent. The conversion device 800 may be designed or customized to a temperature range of a particular location or environment to increase the consistency of the radiation 880. Furthermore, in environments or locations which emit more heat, and thus emit higher frequency radiation, the conversion device 800 need not optimize the frequency proximate the first end 810.

As the ambient radiation 880 enters the first end 810 of the device 800, the radiation, having an initial frequency, $F_I$, can contact or be directed to contact one of the side walls 825, 826 of the channel 805. The angle at which the ambient radiation entering the channel 805 contacts one of the side walls 825, 826, may be at any angle; however, in many embodiments the angle of interaction is close to perpendicular. Embodiments of conversion device 800 mat include a lens, prism, minor, and the like to direct the incoming ambient electromagnetic radiation at specific angles depending on the desired Doppler interaction with the side walls 825, 826, and crystals therein. Upon reflecting off one of the side walls 825, the ambient radiation 880 is blue shifted (i.e. increase frequency), and continues towards the opposing side wall 826 for another Doppler interaction (i.e. another blue shift). The side walls 825, 826 of channel 805 of conversion device 800 may be separated by only a very small distance to obtain numerous Doppler shifts (i.e. blue shifts) during a single favorable vibration phase of an atom. For example, the distance between a first side wall 825 and a second side wall 826 may be at least one half of a wave length, wherein the wave length is determined by the initial frequency, $F_I$, of the ambient radiation 880. In other words, the opposing side walls 825, 826 may be separated by at least 5,000 nanometers. Further embodiments of the conversion device 800 may construct the side walls 825, 826 some multiple of half wave lengths apart from each other to promote uniformity on construction of the device 800. In addition to the uniformity in construction, increased efficiencies due to harmonics can be obtained if the side walls 825, 826 are separated by a multiple of half wave lengths. Furthermore, at least one of the opposing side walls 825, 826 may include or be made of a single or a plurality of crystals. If only one side wall 825 includes or is made of a plurality of crystals, the opposing side wall 826 may be a reflective surface. In many embodiments, both of the side walls 825, 826 include a plurality of crystals, wherein the crystals may vibrate, setting the atoms 50 in motion either toward or away any incoming ambient or reflected radiation. If one of the side walls 826 utilizes a mirrored substance, the reflections from the mirrored substance may be random; therefore, most (potentially all) useful Doppler interactions may occur from the interaction between the radiation (ambient or reflected) and the vibrating atoms 50 of the side wall 825 containing, or made of crystal(s). It is contemplated that if only one side wall 825 includes a plurality of crystals, no synchronization may be needed, thereby simplifying construction.

Alternatively, if both opposing side walls 825, 826 utilize, include, are constructed of, etc., one or more crystals, then useful interactions may occur from the interaction between the radiation (ambient or reflected) and the vibrating atoms 50 of both of the opposing side walls 825, 826. In embodiments where both of the side walls 825, 826 utilize crystals, there may be a need for synchronization. Synchronization involves synchronizing the crystals in the opposing side walls 825, 826 so that the atoms 50 of the crystals in the first side wall 825 vibrate/move towards the atoms 50 of the crystals in the second side wall 826 at the same time so that the ambient radiation 880 being reflected off of the opposing side walls 825, 826 during a favorable vibration phase shall Doppler shift in the same manner (i.e. both blue shift). However, the need for synchronization may depend on the different between the initial frequency, $F_I$, of the ambient radiation 880 and the desired or optimal frequency, $F_{opt}$. For example, if the desired frequency shift (e.g. change in frequency (Hz), or desired increase in frequency) is small, then non-synchronized Doppler side walls 825, 826 may be used as, statistically, favorable interactions may occur sufficiently often so as to result in a favorable net increase in frequency. In contrast, if a greater frequency shift is needed, the side walls 825, 826 may be synchronized for optimum results. One method of synchronization may include applying an electrical charge to the conversion device 800, in particular, to the side walls 825, 826. Those having skill in the art should appreciate that different means may be used to apply an electrical charge, for example, a regulator may provide or apply the electrical charge sufficient to cause synchronization of the crystal atoms 50 in the side walls 825, 826. Furthermore, the resonance frequency (i.e. frequency of the vibrating crystals) may be selected so that it is slightly above the resonance frequency that would occur near the ambient temperature level. In this manner, the bulk of the energy causing the Doppler interaction may be that supplied by the ambient heat as opposed to the electrical charge causing the resonance. One purpose of the resonance may be to synchronize the timing such that favorable Doppler interactions occur. For instance, higher resonance frequencies can be applied, but may result in a need for a greater input energy (i.e. other than from the ambient area). Therefore, once a desired frequency is obtained, the emitted radiation 885 may be directed to target 70, such as a PV cell, wherein the target 70 may generate electricity.

Moreover, approximately 3650 Doppler interactions can occur during a single positive vibration phase of an atom. Accordingly, the Doppler shift/change in frequency during a single positive vibration phase of an atom may be $3.24 \times 10^{11}$ Hz. By determining the initial frequency, $F_I$, or input frequency, and calculating, determining, utilizing, and/or providing the required/desired optimal frequency, $F_{opt}$, or output frequency, the conversion device 800 may be constructed, dimensioned, structured, etc., to achieve the necessary number of Doppler interactions. For example, if the amount of the required blueshift (frequency shift—increase) is greater than what can be achieved during a single favorable phase of a vibration of an atom (e.g. $3.24 \times 10^{11}$), then the reflected radiation may be directed through a time distance extender 450, 550, 650 after each favorable vibration phase and then redirected to one of the side walls 825, 826 to achieve repeated favorable Doppler blue shifts until the optimal frequency, $F_{opt}$, is reached.

Furthermore, the frequency of the radiation passing through the channel 805 may be split proximate the second end 820, or output end, such that the radiation having a frequency equal to the optimal frequency, $F_{opt}$, may be directed towards the target 70, and the radiation having a lower frequency than the optimal frequency, $F_{opt}$, may be redirected to same device 800 or another device 800 placed in series or parallel. However, radiation having a frequency lower than the optimal frequency, $F_{opt}$, (e.g. waste energy) may not be a concern because it will be converted into ambient heat that may increase the ambient temperature, thereby increasing the vibration speed of the crystal atoms and the initial frequency, $F_I$, of the ambient radiation 880. If the device 800 is placed in a higher ambient temperature environment, such as the cooling towers in an industrial or traditional power generation facility, the device 800 may be designed so that all or most of the Doppler interactions may occur during a useful phase of one vibration of an atom 50.

Referring still to FIG. 12, an embodiment of a ambient heat conversion device 800 may be described in the following example: If the device 800 is placed in an environment where the ambient temperature is 55° F. (286 K), such as an average basement environment, the ambient radiation 880 has an average wave length of 10,133 nanometers and an initial frequency, $F_I$, of $2.958575 \times 10^{13}$ Hz, and the desired optimal frequency, $F_{opt}$, is $4.1 \times 10^{14}$ Hz, then a frequency shift (i.e. blue shift—increase in frequency) of $3.804 \times 10^{14}$ Hz is needed. Because the ambient temperature is 55° F. (286K), this example assumes that the average speed of the atom 50 is 900 meters per second (m/s). Therefore, the average Doppler shift (i.e. change in frequency) per interaction (i.e. radiation contacting vibrating crystal of side walls 825, 826) is approximately $8.9 \times 10^7$ Hz. Further, if the average favorable distance of the vibration during a favorable vibration phase is 111 nanometers (i.e. width of the atom 50, for example, a silicone atom) at 900 meters per seconds for $1.233 \times 10^{-10}$ seconds, during which time radiation would travel 0.0369744 meters, then 3650 favorable Doppler interactions (e.g. of 10,132 nanometers) may occur during a single favorable vibration phase of an atom 50. The 3650 Doppler interactions may result in a frequency shift/increase of $3.24 \times 10^{11}$ Hz, which depending on the initial frequency, $F_I$, and the optimal frequency, $F_{opt}$, may result in a favorable frequency change after a single favorable interaction. To achieve the optimal frequency, $F_{opt}$, of $4.1 \times 10^{14}$ in this example, a total of 4,274,382 Doppler interactions would be required. Because 3650 Doppler interactions occur during a single favorable vibration phase, the optimal frequency, $F_{opt}$, may be achieved with 1,171 favorable atom 50 vibration phase interactions. Because the distance between each interaction is on the micron level, the duration of all of the interactions may be $4.5 \times 10^{-7}$ seconds. One having skill in the art should understand that thousands, hundreds of thousands, millions, etc., of Doppler interactions may occur each second to constantly convert ambient heat and radiation to an optimal frequency, $F_{opt}$, which is directed to a target 70 to generate electricity. A lens, prism, mirror, and the like may be used to direct the emitted radiation 885 toward the target 70. Those skilled in the art should also appreciate that the variables used in the above example may change, and may vary based on the environment and target 70 requirements. For instance, the distance of vibration may be more than or less than the width of an atom 50.

Some of the advantages of conversion device 800 include low cost for producing energy, especially considering the alternative methods of producing energy may be costly, unfeasible, unsustainable, and the like. Conversion device 800 may not be dependent on wind, tides, sunlight, or any of the ephemeral needs which are generally associated with green/clean energy. Additionally, device 800 operates continuously once placed in its environment, and may not need/ require backup generators. For example, the ambient heat in an environment may be recharged by the ambient heat from an adjacent area. The conversion device 800 may also be placed/installed in numerous environments, including basements, foundations, tunnels, caves, inside of electrical device, engine compartments. This flexibility in placement may eliminate the need for transmission lines, which are costly and a source for energy loss. Furthermore, device 800 may consistently and continuously produce renewable energy at night in hostile environments, such as a battlefield, lessening or possibly eliminating the need for logistical supplies.

Moreover, the device 800 is lightweight and small which may ease transport and handling of the same. Due to the compact nature of the device 800, it may be used/utilized as a charger or a power cell battery source. For instance, it could be built into cellular phones or other electronic devices to provide a primary or back power source. In addition, the device could be constructed to provide an efficient infrared radiation collector. It is further contemplated that hundred, thousand, even millions of devices 800 may be placed on a single chip, even if each device 800 only produces a small amount of electricity the aggregate effect may be sufficient. Embodiments of the device 800 may be used for other applications in addition to those expressly disclosed herein.

Referring to FIGS. 1-12, embodiments of a method of optimizing electromagnetic radiation is also disclosed. The method of optimizing electromagnetic radiation may comprise the following steps: providing a channel having a first end, a separator positioned proximate the first end, a second end, a focusing member positioned proximate the second end, at least two parallel walls having an reflective surface, wherein the at least two parallel side walls connect the first end and the second end, and at least one absorption area located on the reflective surface, vibrating the at least two parallel walls, wherein the parallel walls contain at least one crystal capable of vibration, directing the incoming electromagnetic radiation toward the at least two parallel walls, wherein contact between the incoming electromagnetic radiation and the vibration of the at least one crystal alters a frequency of the electromagnetic radiation toward the optimal frequency.

The method may also comprise the steps of: determining an optimal frequency relative to a usable frequency of a target, separating an incoming electromagnetic radiation into component frequencies, passing the optimal frequency through the second end, capturing a portion of the incoming electromagnetic radiation in the absorption area to cause the vibration, inserting a pair of mirrors between the at least two side walls, and positioning the target near the second end.

Another embodiment of a method of optimizing electromagnetic radiation frequency to increase the efficiency of a photovoltaic cell may include the steps of providing a crystal positioned in a channel undergoing a vibration, wherein an interaction between an incoming electromagnetic radiation and the vibration of the crystal optimizes a frequency of the electromagnetic radiation, accepting the incoming electromagnetic radiation from a source through the first end, shifting the frequency of the electromagnetic radiation within the channel to achieve an optimal frequency of the electromagnetic radiation, and positioning a photovoltaic material a distance away from the channel.

Referring still to FIGS. 1-12, an embodiment of a method of converting ambient heat to electricity may include the steps of providing a conversion device 800 including: a first end 810 configured to accept ambient electromagnetic radiation 880, the ambient electromagnetic radiation 880 having an initial frequency, $F_I$, a second end 820 configured to allow the ambient electromagnetic radiation 880 to exit; and at least two opposing walls 825, 826 connecting the first end 810 and the second end 820, wherein the at least two opposing walls 825, 826 include at least one crystal, the at least two opposing walls 825, 826 being separated by at least one-half of a wave length, utilizing vibration of the at least one crystal least two opposing walls 825, 826, wherein the vibration causes atoms of one or more crystals to move in a direction towards the accepted ambient electromagnetic radiation 880, and repeatedly increasing the initial frequency, $F_I$, of the ambient electromagnetic radiation 880 through interactions with the at least two opposing walls 825, 826 until the ambient electromagnetic radiation 880 reaches an optimal frequency, $F_{opt}$. Embodiments of this may further include the steps of obtaining an optimal frequency, $F_{opt}$ relative to a usable frequency of a target 70, dividing the incoming ambient electromagnetic radiation into component frequencies, passing the ambient electromagnetic radiation 880 through the second end 820, providing a pair of reflective surfaces between said at least two side walls 825, 826, extending a time and a distance in which the ambient electromagnetic radiation 880 travels within the conversion device 800, and placing a target 700 proximate or otherwise near the second end 820. In one embodiment, the target may be a semiconductor. In another embodiment, the target may be a photovoltaic cell. Furthermore, the conversion device 800 may be placed in at least one of a high temperature environment and a low temperature environment.

Various modifications and variations of the described apparatus and method will be apparent to those skilled in the art without departing from the scope and spirit of the invention. Although this invention has been described in connection with specific embodiments, outlined above, it should be understood that the invention should not be unduly limited to such specific embodiments. Various changes may be made without departing from the spirit and scope of the invention.

What is claimed is:

1. A device comprising:
   a conversion channel including:
   a first end configured to accept ambient electromagnetic radiation, the ambient electromagnetic radiation having an initial frequency;
   a second end configured to allow the ambient electromagnetic radiation to exit; and
   at least two opposing walls connecting the first end and the second end, wherein the at least two opposing walls include one or more crystals, the at least two opposing walls being separated by at least one-half of a wave length;
   wherein when the ambient electromagnetic radiation interacts with the one or more crystals of the at least two opposing side walls, the initial frequency of the ambient electromagnetic radiation being repeatedly increased to an optimal frequency.

2. The device of claim 1, wherein the optimal frequency is high enough to produce electricity.

3. The device of claim 1, wherein the ambient electromagnetic radiation exiting the conversion channel radiates toward a target.

4. The device of claim 3, wherein the target is a semiconductor.

5. The device of claim 3, wherein the target is a photovoltaic cell.

6. The device of claim 1, wherein the one or more crystals comprises a material selected from a group consisting of: Silicon, $SiO_2$, $LiNbO_3$, GaAs, GeAsSe, $BaF_2$, ZnSe, ZnS, $Al_2O_3$, ceramics, metals, carbon, diamond, beryllium, iron, brass, copper, tin, nickel, chromium, magnesium, barium titanate, zinc sulphide, tourmaline, hydrogen phosphate, magnesium oxide, silicon nitrate, silicon carbon, hafnium, reflective gas, reflective liquid, or any combinations or mixtures thereof.

7. The device of claim 1, wherein a planar surface is in communication with the at least two opposed side walls and the first end and the second end.

8. The device of claim 1, wherein more than one conversion channel is positioned in succession.

9. The device of claim 1, wherein the at least two opposing walls are separated by at least 5,000 nanometers.

10. The device of claim 1, wherein an electric charge is applied to the conversion channel to synchronize an initial movement of the plurality of crystals.

11. A device comprising:
    a first side wall and a second side wall connected forming a conversion channel, the conversion channel having a first end and a second end, wherein the first side wall is constructed out of one or more crystals and the second side wall is a reflective surface;
    wherein the conversion channel captures ambient infrared radiation having an initial frequency from an environment proximate the first end, and repeatedly increases the initial frequency to an optimal frequency through a plurality of interactions between the ambient infrared radiation and at least one atom of the one or more crystals making up the first side wall, further wherein the at least one atom is moving toward the incoming infrared radiation during a single interaction.

12. The device of claim 11, wherein the conversion channel is placed proximate a photovoltaic cell.

13. The device of claim 11, wherein the optimal frequency is high enough to convert to electricity.

14. The device of claim 11, wherein vibration of the one or more crystals causes the at least one atom to move.

15. The device of claim 11, wherein the one or more crystals comprises a material selected from a group consisting of: Silicon, $SiO_2$, $LiNbO_3$, GaAs, GeAsSe, $BaF_2$, ZnSe, ZnS, $Al_2O_3$, ceramics, metals, carbon, diamond, beryllium, iron, brass, copper, tin, nickel, chromium, magnesium, barium titanate, zinc sulphide, tourmaline, hydrogen phosphate, magnesium oxide, silicon nitrate, silicon carbon, hafnium, reflective gas, reflective liquid, or any combinations or mixtures thereof.

16. A method of converting ambient heat to electricity comprising:
    providing a conversion device including:
    a first end configured to accept ambient electromagnetic radiation, the ambient electromagnetic radiation having an initial frequency;

a second end configured to allow the ambient electromagnetic radiation to exit; and at least two opposing walls connecting the first end and the second end, wherein the at least two opposing walls include one or more crystals, the at least two opposing walls being separated by at least one-half of a wave length;

utilizing vibration of one or more crystals making up the at least two opposing walls, wherein the vibration causes atoms of one or more crystals to move in a direction towards the accepted ambient electromagnetic radiation; and repeatedly increasing the initial frequency of the ambient electromagnetic radiation through interactions with the at least two opposing walls until the ambient electromagnetic radiation reaches an optimal frequency.

17. The method of claim 16, further comprising:

obtaining an optimal frequency relative to a usable frequency of a target;

dividing an incoming ambient electromagnetic radiation into component frequencies;

passing the ambient electromagnetic radiation through the second end;

providing a pair of reflective surfaces between the at least two side walls;

extending a time and a distance in which said ambient electromagnetic radiation travels within said conversion device; and placing a target near said second end.

18. The method of claim 16, wherein said target is a semiconductor.

19. The method of claim 16, wherein the target is a photovoltaic cell.

20. The method of claim 16, wherein the one or more crystals comprises a material selected from a group consisting of: Silicon, $SiO_2$, $LiNbO_3$, GaAs, GeAsSe, $BaF_2$, ZnSe, ZnS, $Al_2O_3$, ceramics, metals, carbon, diamond, beryllium, iron, brass, copper, tin, nickel, chromium, magnesium, barium titanate, zinc sulphide, tourmaline, hydrogen phosphate, magnesium oxide, silicon nitrate, silicon carbon, hafnium, reflective gas, reflective liquid, or any combinations or mixtures thereof.

* * * * *

UNITED STATES PATENT AND TRADEMARK OFFICE
CERTIFICATE OF CORRECTION

| | |
|---|---|
| PATENT NO. | : 8,111,970 B2 |
| APPLICATION NO. | : 12/895985 |
| DATED | : February 7, 2012 |
| INVENTOR(S) | : Herrmann, Jr. |

It is certified that error appears in the above-identified patent and that said Letters Patent is hereby corrected as shown below:

Please replace the drawings of sheets 3, 4, 5, 7, 8, 10, and 12 with the attached drawings.

In column 3, line 48, after "of" please delete "minors" and insert -- mirrors --

In column 3, line 51, after "of" please delete "minors" and insert -- mirrors --

In column 4, line 34, after "reflected" please delete "of" and insert -- off --

In column 5, line 11, after "convex" please delete "minors" and insert -- mirrors --

In column 5, line 54, after "of" please delete "minors" and insert -- mirrors --

In column 6, line 63, after "sources" please insert -- of --

In column 8, line 27, after "of" please delete "minors" and insert -- mirrors --

In column 9, line 50, after "wherein c" please delete "-" and insert -- = --

In column 11, line 29, after "down" please delete "the speed"

In column 12, line 39, after "the" please delete "minors" and insert -- mirrors --

In column 12, line 57, after "may not" please delete "be"

In column 13, line 7, after "one of the" please delete "minors" and insert -- mirrors --

In column 13, line 18, after "approximately" please delete "a"

In column 13, line 23, after "towards the" please delete "minors" and insert -- mirrors --

Signed and Sealed this
Twelfth Day of June, 2012

David J. Kappos
*Director of the United States Patent and Trademark Office*

CERTIFICATE OF CORRECTION (continued)
U.S. Pat. No. 8,111,970 B2

In column 14, line 7, after "its" please delete "minors" and insert -- mirrors --

In column 16, line 33, after "becomes" please delete "wither" and insert -- whether --

In column 17, line 46, after "device 800" please delete "mat" and insert -- may --

In column 17, line 46, after "prism" please delete "minor" and insert -- mirror --

In column 18, line 33, after "the" delete "different" and insert -- difference --

In column 20, line 3, after "prism" please delete "minor" and insert -- mirror --

In column 20, line 37, after "that" please delete "hundred" and insert -- hundreds --

In column 20, line 38, after "hundreds" please delete "thousand" and insert -- thousands --

In column 20, line 66, after "of" please delete "minors" and insert -- mirrors --

In column 21, line 24, after "crystal" please insert -- and at --